United States Patent
Tada et al.

(10) Patent No.: US 11,784,209 B2
(45) Date of Patent: Oct. 10, 2023

(54) DETECTION DEVICE

(71) Applicant: Japan Display Inc., Tokyo (JP)

(72) Inventors: Masahiro Tada, Tokyo (JP); Makoto Uchida, Tokyo (JP); Takashi Nakamura, Tokyo (JP)

(73) Assignee: Japan Display Inc., Tokyo (JP)

( * ) Notice: Subject to any disclaimer, the term of this patent is extended or adjusted under 35 U.S.C. 154(b) by 211 days.

(21) Appl. No.: 17/349,079

(22) Filed: Jun. 16, 2021

(65) Prior Publication Data
US 2021/0313384 A1   Oct. 7, 2021

Related U.S. Application Data

(63) Continuation of application No. PCT/JP2019/043293, filed on Nov. 5, 2019.

(30) Foreign Application Priority Data

Dec. 21, 2018   (JP) ................................ 2018-240307

(51) Int. Cl.
*H01L 27/146*   (2006.01)
*H01L 29/786*   (2006.01)
(Continued)

(52) U.S. Cl.
CPC .... *H01L 27/14678* (2013.01); *G06V 40/1318* (2022.01); *H01L 27/1461* (2013.01);
(Continued)

(58) Field of Classification Search
CPC ........... H01L 27/14678; H01L 27/1461; H01L 27/14616; H01L 27/1214; H01L 27/14609;
(Continued)

(56) References Cited

U.S. PATENT DOCUMENTS

| | | | |
|---|---|---|---|
| 2002/0063302 A1 | 5/2002 | Furumiya et al. | |
| 2003/0090650 A1* | 5/2003 | Fujieda | G06V 40/1394 356/71 |

(Continued)

FOREIGN PATENT DOCUMENTS

| | | |
|---|---|---|
| JP | S63-074275 A | 4/1988 |
| JP | 2002-170945 A | 6/2005 |

(Continued)

OTHER PUBLICATIONS

International Search Report issued in International Patent Application No. PCT/JP2019/043293 dated Jan. 28, 2019 and English translation of same. 7 pages.

(Continued)

*Primary Examiner* — Sitaramarao S Yechuri
(74) *Attorney, Agent, or Firm* — K&L Gates LLP

(57) ABSTRACT

A detection device comprising: an insulating substrate; a plurality of gate lines that are provided on the insulating substrate, and extend in a first direction; a plurality of signal lines that are provided on the insulating substrate, and extend in a second direction intersecting the first direction; a switching element coupled to each of the gate lines and each of the signal lines; a first photoelectric conversion element that comprises a first semiconductor layer containing amorphous silicon, and is coupled to the switching element; and a second photoelectric conversion element that comprises a second semiconductor layer containing polysilicon, and is coupled to the switching element.

12 Claims, 20 Drawing Sheets

(51) Int. Cl.
  *H01L 31/0368* (2006.01)
  *H01L 31/0376* (2006.01)
  *H01L 31/105* (2006.01)
  *G06V 40/13* (2022.01)

(52) U.S. Cl.
  CPC .. *H01L 27/14616* (2013.01); *H01L 29/78633* (2013.01); *H01L 29/78675* (2013.01); *H01L 31/03682* (2013.01); *H01L 31/03762* (2013.01); *H01L 31/105* (2013.01)

(58) Field of Classification Search
  CPC ......... H01L 29/78633; H01L 29/78675; H01L 31/03682; H01L 31/03762; H01L 31/105; G06V 40/1318; Y02E 10/546; Y02E 10/548
  See application file for complete search history.

(56) References Cited

U.S. PATENT DOCUMENTS

| | | |
|---|---|---|
| 2005/0045881 A1 | 3/2005 | Nakamura et al. |
| 2005/0056842 A1* | 3/2005 | Nishi ............... H01L 29/66757 257/E27.129 |
| 2006/0191567 A1 | 8/2006 | Mitsui |
| 2007/0170478 A1 | 7/2007 | Araki |
| 2007/0291325 A1 | 12/2007 | Toyota et al. |
| 2009/0289910 A1* | 11/2009 | Hattori ............... G02F 1/13338 345/173 |
| 2012/0085892 A1 | 4/2012 | Hirose |
| 2018/0012069 A1 | 1/2018 | Chung et al. |
| 2018/0019363 A1 | 1/2018 | Takahashi et al. |
| 2018/0097027 A1 | 4/2018 | Saitoh et al. |

FOREIGN PATENT DOCUMENTS

| | | |
|---|---|---|
| JP | 2006-003857 A | 1/2006 |
| JP | 2006-270090 A | 10/2006 |
| JP | 2007-201009 A | 8/2007 |
| JP | 2009-200104 A | 9/2009 |
| JP | 2009-244638 A | 10/2009 |
| JP | 2009-282303 A | 12/2009 |
| JP | 2012-099801 A | 5/2012 |
| JP | 2018-019068 A | 2/2018 |
| JP | 2018-142839 A | 9/2018 |
| WO | WO2005/104234 A1 | 11/2005 |
| WO | WO2016/167277 A1 | 10/2016 |

OTHER PUBLICATIONS

Written Opinion issued in International Patent Application No. PCT/JP2019/043293 dated Jan. 28, 2019. 5 pages.
Office Action issued in related Japanese Patent Application No. 2018-240307 dated Nov. 1, 2022 and English translation of same. 9 pages.

* cited by examiner

DETECTION DEVICE

CROSS-REFERENCE TO RELATED APPLICATION

This application is a continuation of PCT international application No. PCT/JP2019/043293 filed on Nov. 5, 2019, which designates the United States, incorporated herein by reference, and which claims the benefit of priority from Japanese Patent Application No. 2018-240307 filed on Dec. 21, 2018, incorporated herein by reference.

BACKGROUND

1. Technical Field

The present disclosure relates to a detection device.

2. Description of the Related Art

In these years, optical biosensors are known as biosensors used, for example, for personal authentication. Fingerprint sensors (refer, for example, to United States Patent Application Publication No. 2018/0012069 (US-A-2018/0012069)) and vein sensors are known as the biosensors. In such a fingerprint sensor described in US-A-2018/0012069, a plurality of photoelectric conversion elements, such as photodiodes, are arranged on a semiconductor substrate. Signals output from the photoelectric conversion elements change with an amount of irradiating light.

Such a biosensor using an optical sensor is required to detect not only a shape of a fingerprint of an object to be detected such as a finger or a palm, but also various types of biological information on the object to be detected. For example, the wavelength of light and the detection sensitivity differ between fingerprint detection and vein detection. For example, in US-A-2018/0012069, a sensitive wavelength range is determined by characteristics of the photoelectric conversion elements. Therefore, a plurality of different types of biological information, such as the fingerprint and the veins, may be difficult to be well detected using the same detection device.

SUMMARY

A detection device according to an embodiment of the present disclosure comprising: an insulating substrate; a plurality of gate lines that are provided on the insulating substrate, and extend in a first direction; a plurality of signal lines that are provided on the insulating substrate, and extend in a second direction intersecting the first direction; a switching element coupled to each of the gate lines and each of the signal lines; a first photoelectric conversion element that comprises a first semiconductor layer containing amorphous silicon, and is coupled to the switching element; and a second photoelectric conversion element that comprises a second semiconductor layer containing polysilicon, and is coupled to the switching element.

DETAILED DESCRIPTION

Figure 1:
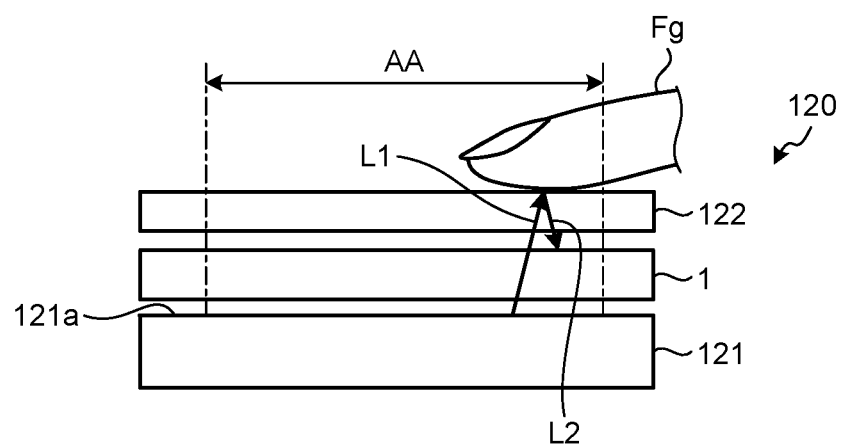
FIG. 1 is a sectional view illustrating a schematic sectional configuration of a detection apparatus having a lighting device including a detection device according to a first embodiment of the present disclosure.

The following describes embodiments for carrying out the present disclosure in detail with reference to the drawings. The present disclosure is not limited to the description of the embodiments given below. Components to be described below include those easily conceivable by those skilled in the art or those substantially identical thereto. Moreover, the components to be described below can be appropriately combined. What is disclosed herein is merely an example, and the present disclosure naturally encompasses appropriate modifications easily conceivable by those skilled in the art while maintaining the gist of the disclosure. To further clarify the description, the drawings schematically illustrate, for example, widths, thicknesses, and shapes of various parts as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

First Embodiment

FIG. 1 is a sectional view illustrating a schematic sectional configuration of a detection apparatus having a lighting device including a detection device according to a first embodiment of the present disclosure. As illustrated in FIG. 1, a detection apparatus 120 having a lighting device includes a detection device 1, a lighting device 121, and a cover glass 122. The lighting device 121, the detection device 1, and the cover glass 122 are stacked in this order in a direction orthogonal to a surface of the detection device 1.

The lighting device 121 has a light-emitting surface 121a for emitting light, and emits light L1 from the light-emitting surface 121a toward the detection device 1. The lighting device 121 is backlight. The lighting device 121 may be what is called a side light-type backlight that includes a light guide plate provided in a position corresponding to a detection area AA and a plurality of light sources arranged at one end or both ends of the light guide plate. For example, light-emitting diodes (LEDs) for emitting light in a predetermined color are used as the light sources. The lighting device 121 may be what is called a directly below-type backlight that includes light sources (such as LEDs) provided directly below the detection area AA. The lighting device 121 is not limited to the backlight. The lighting device 121 may be provided on a lateral side or an upper side of the detection device 1, and may emit the light L1 from the lateral side or the upper side of a finger Fg.

The detection device 1 is provided so as to face the light-emitting surface 121a of the lighting device 121. In other words, the detection device 1 is provided between the lighting device 121 and the cover glass 122. The light L1 emitted from the lighting device 121 passes through the detection device 1 and the cover glass 122. The detection device 1 is, for example, a light reflective fingerprint sensor, and can detect asperities (such as a fingerprint) on a surface of the finger Fg by detecting light L2 reflected on an interface between the cover glass 122 and air. Alternatively, the detection device 1 may detect biological information by detecting the light L2 reflected in the finger Fg, in addition to detecting the fingerprint. The biological information is, for example, a blood vessel image of veins or the like, pulsation, and a pulse wave. The color of the light L1 from the lighting device 121 may be changed depending on the detection target. For example, in the case of the fingerprint detection, the lighting device 121 can emit the blue or green light L1, and in the case of the vein detection, the lighting device 121 can emit the infrared light L1.

The cover glass 122 is a member for protecting the detection device 1 and the lighting device 121, and covers the detection device 1 and the lighting device 121. The cover glass 122 is, for example, a glass substrate. The cover glass 122 is not limited to the glass substrate, and may be, for example, a resin substrate. The cover glass 122 need not be provided. In this case, a protection layer is provided on the surface of the detection device 1, and the finger Fg makes contact with the protection layer of the detection device 1.

The detection apparatus 120 having a lighting device may be provided with a display panel instead of the lighting device 121. The display panel may be, for example, an organic electroluminescent (EL) (organic light-emitting diode (OLED)) display panel or an inorganic EL (µ-LED or mini-LED) display. Alternatively, the display panel may be a liquid crystal display (LCD) panel that uses liquid crystal elements as display elements, or an electrophoretic display (EPD) panel that uses electrophoretic elements as the display elements. Even in this case, display light emitted from the display panel passes through the detection device 1, and the fingerprint of the finger Fg and the biological information can be detected based on the light L2 reflected by the finger Fg.

Figure 2:
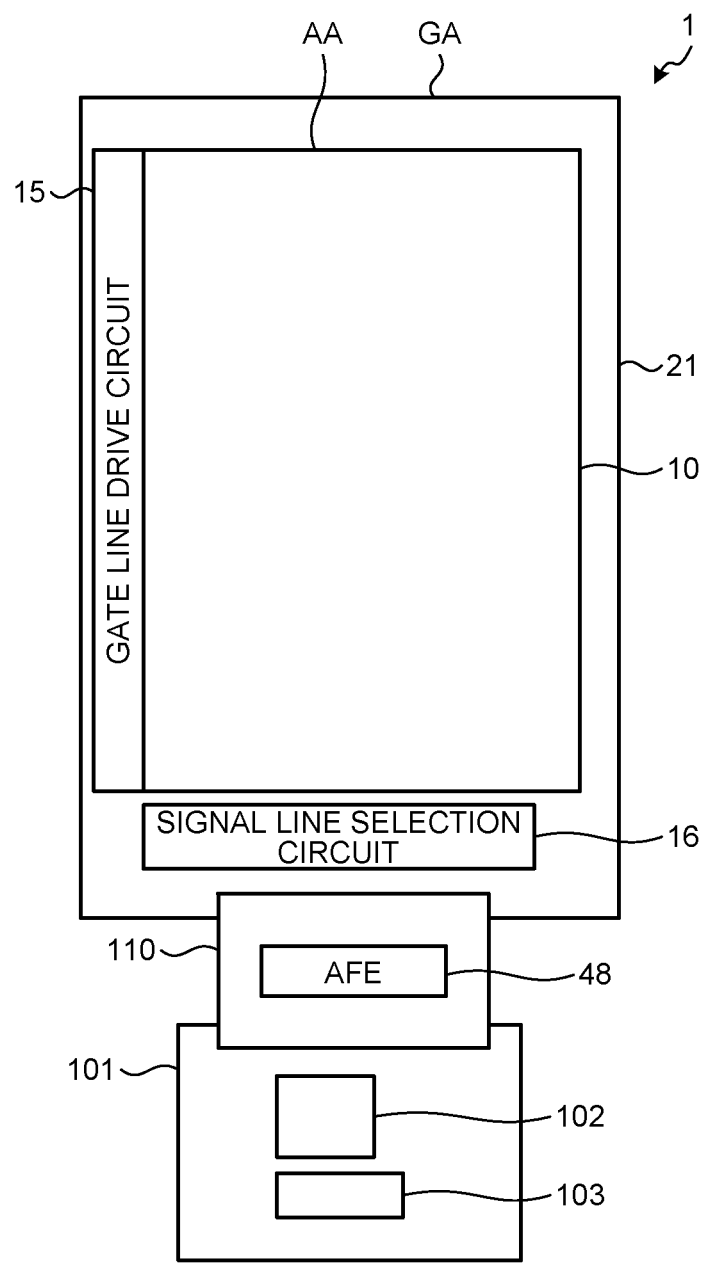
FIG. 2 is a plan view illustrating the detection device according to the first embodiment.
Figure 3:
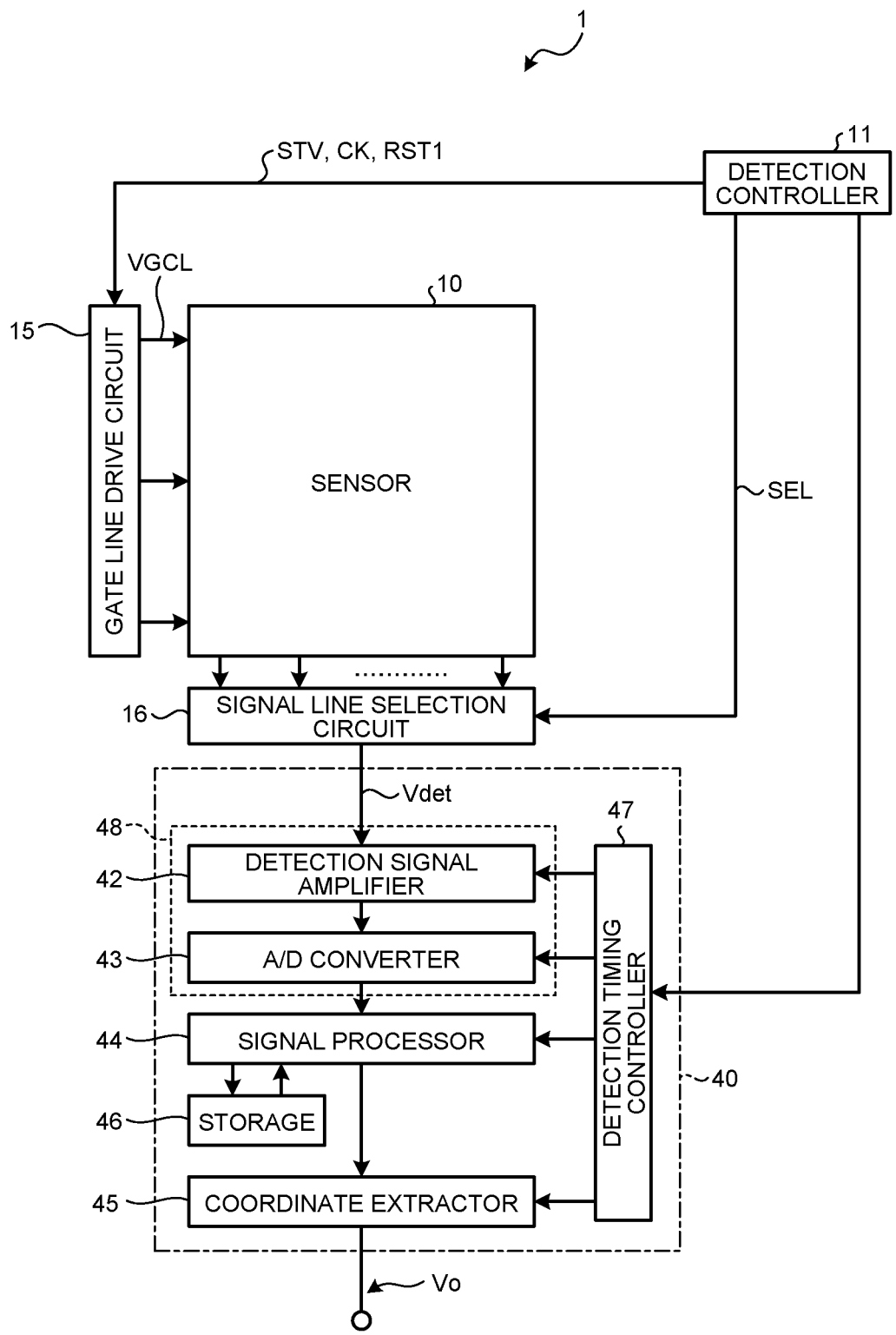
FIG. 3 is a block diagram illustrating a configuration example of the detection device according to the first embodiment.

FIG. 2 is a plan view illustrating the detection device according to the first embodiment. FIG. 3 is a block diagram illustrating a configuration example of the detection device according to the first embodiment. As illustrated in FIG. 2, the detection device 1 includes an insulating substrate 21, a sensor 10, a gate line drive circuit 15, a signal line selection circuit 16, an analog front-end circuit (hereinafter, called "AFE") 48, a control circuit 102, and a power supply circuit 103.

As illustrated in FIG. 2, a control board 101 is electrically coupled to the insulating substrate 21 through a flexible printed circuit board 110. The flexible printed circuit board 110 is provided with the AFE 48. The control board 101 is provided with the control circuit 102 and the power supply circuit 103. The control circuit 102 is, for example, a field programmable gate array (FPGA). The control circuit 102 supplies control signals to the sensor 10, the gate line drive circuit 15, and the signal line selection circuit 16 to control a detection operation of the sensor 10. The power supply circuit 103 supplies voltage signals including, for example, a power supply signal SVS (refer to FIG. 6) to the sensor 10 and the gate line drive circuit 15.

The insulating substrate 21 has a detection area AA and a peripheral area GA. The detection area AA is an area overlapping a plurality of first photodiodes PD1 and a plurality of second photodiodes PD2 (refer to FIG. 5) included in the sensor 10. The peripheral area GA is an area outside the detection area AA, and is an area overlapping neither the first photodiodes PD1 nor the second photodiodes PD2. That is, the peripheral area GA is an area between the outer circumference of the detection area AA and the ends of the insulating substrate 21. The gate line drive circuit 15 and the signal line selection circuit 16 are provided in the peripheral area GA.

As illustrated in FIG. 3, the detection device 1 further includes a detection controller 11 and a detector 40. The control circuit 102 includes some or all functions of the detection controller 11. The control circuit 102 also includes some or all functions of the detector 40 except that of the AFE 48.

The sensor 10 is an optical sensor including the first and the second photodiodes PD1 and PD2 that serve as photoelectric conversion elements. Each of the first and the second photodiodes PD1 and PD2 included in the sensor 10 outputs an electrical signal corresponding to light emitted thereto as a detection signal Vdet to the signal line selection circuit 16. The sensor 10 performs the detection in response to a gate drive signal VGCL supplied from the gate line drive circuit 15.

The detection controller 11 is a circuit that supplies respective control signals to the gate line drive circuit 15, the signal line selection circuit 16, and the detector 40 to control operations thereof. The detection controller 11 supplies various control signals including, for example, a start signal STV, a clock signal CK, and a reset signal RST1 to the gate line drive circuit 15. The detection controller 11 also supplies various control signals including, for example, a selection signal SEL to the signal line selection circuit 16.

The gate line drive circuit 15 is a circuit that drives a plurality of gate lines GCL (refer to FIG. 4) based on the various control signals. The gate line drive circuit 15 sequentially or simultaneously selects the gate lines GCL, and supplies the gate drive signals VGCL to the selected gate lines GCL. Through this operation, the gate line drive circuit 15 selects the first and the second photodiodes PD1 and PD2 coupled to the gate lines GCL.

Figure 4:
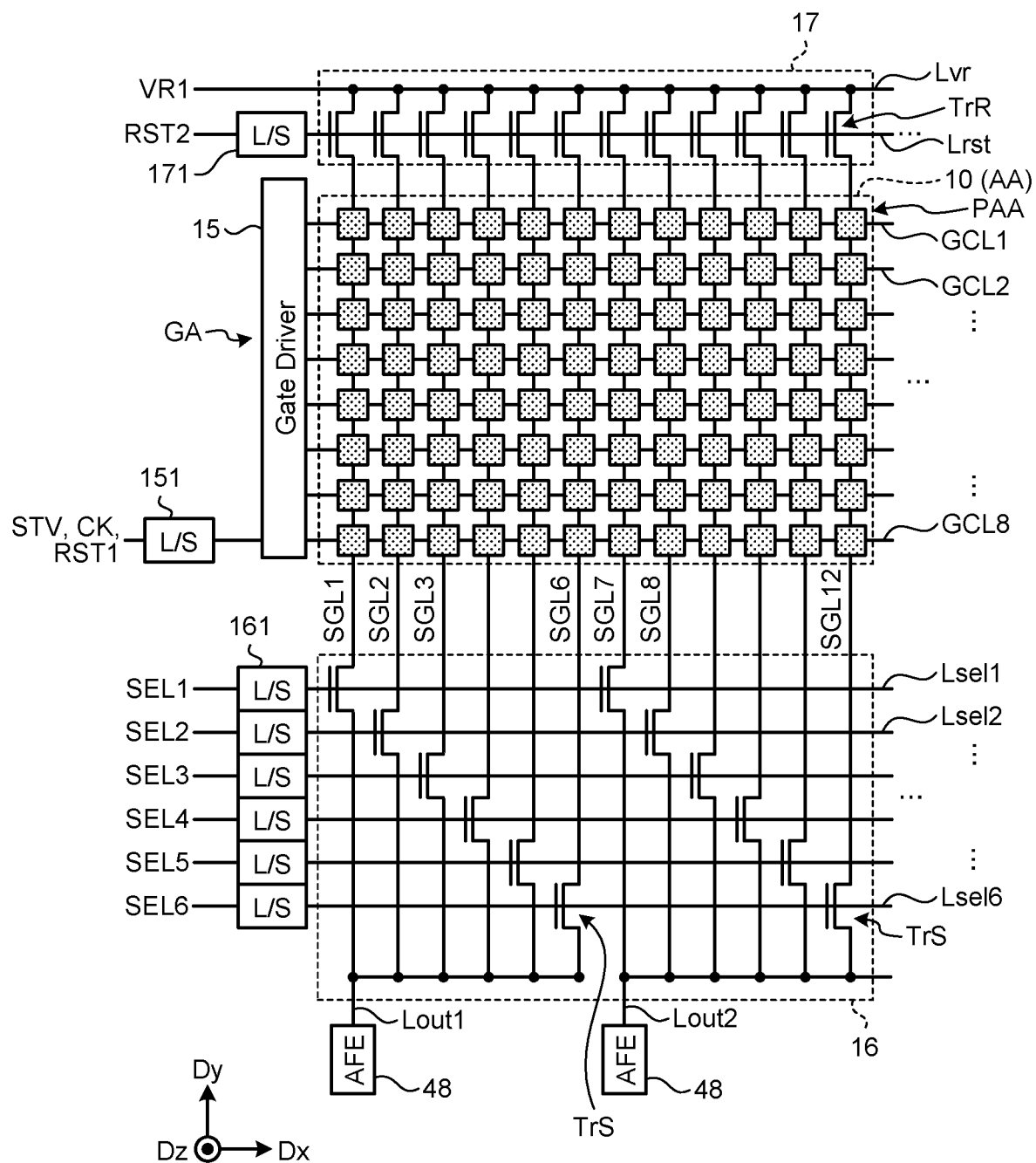
FIG. 4 is a circuit diagram illustrating the detection device.

The signal line selection circuit 16 is a switch circuit that sequentially or simultaneously selects a plurality of signal lines SGL (refer to FIG. 4). The signal line selection circuit 16 couples the selected signal lines SGL to the AFE 48 serving as a detection circuit based on the selection signal SEL supplied from the detection controller 11. Through this operation, the signal line selection circuit 16 outputs the detection signal Vdet of each of the first and the second photodiodes PD1 and PD2 to the detector 40. The signal line selection circuit 16 is, for example, a multiplexer.

The detector 40 includes the AFE 48, a signal processor 44, a coordinate extractor 45, a storage 46, and a detection timing controller 47. The detection timing controller 47 controls, based on a control signal supplied from the detection controller 11, the AFE 48, the signal processor 44, and the coordinate extractor 45 so as to operate in synchronization with one another.

The AFE 48 is a signal processing circuit having functions of at least a detection signal amplifier 42 and an analog-to-digital (A/D) converter 43. The detection signal amplifier 42 amplifies the detection signal Vdet. The A/D converter 43 converts an analog signal output from the detection signal amplifier 42 into a digital signal.

The signal processor 44 is a logic circuit that detects a predetermined physical quantity received by the sensor 10 based on an output signal of the AFE 48. When the finger Fg is in contact with or in proximity to a detection surface, the signal processor 44 can detect the asperities of the surface of the finger Fg or the palm based on the signal from the AFE 48.

The storage 46 temporarily stores therein a signal calculated by the signal processor 44. The storage 46 may be, for example, a random-access memory (RAM) or a register circuit.

The coordinate extractor 45 is a logic circuit that obtains detected coordinates of the asperities of the surface of, for example, the finger Fg when the contact or the proximity of the finger Fg is detected by the signal processor 44. The coordinate extractor 45 combines the detection signals Vdet output from the first and the second photodiodes PD1 and PD2 of the sensor 10 to generate two-dimensional information representing a shape of the asperities of the surface of, for example, the finger Fg. The coordinate extractor 45 may output the detection signals Vdet as sensor outputs Vo, without calculating the detected coordinates.

Figure 5:
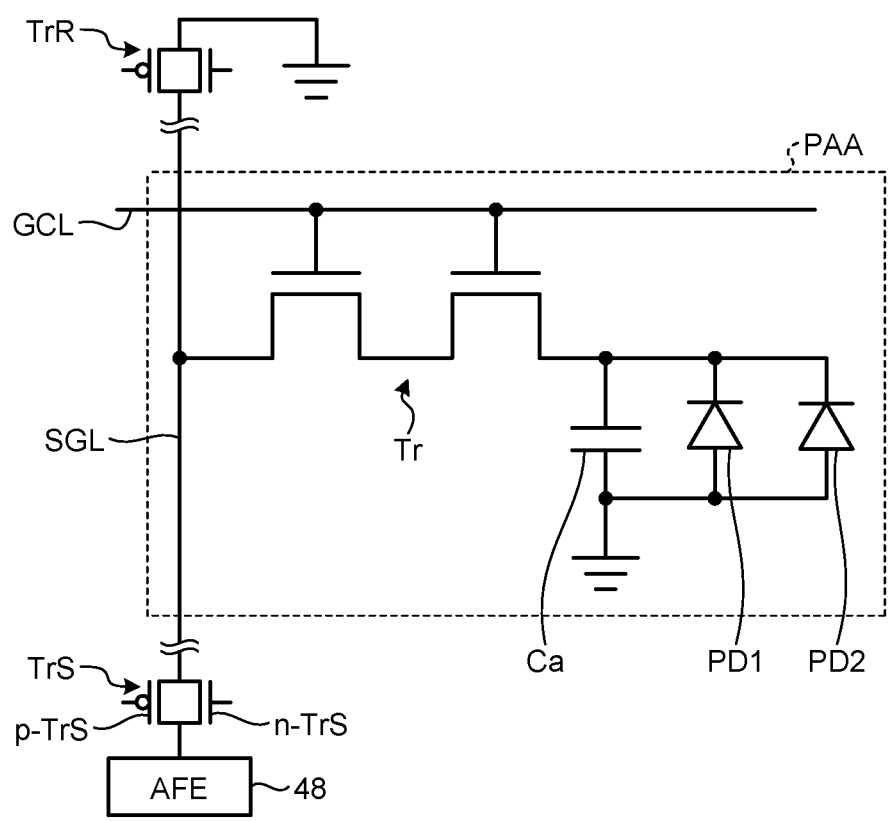
FIG. 5 is a circuit diagram illustrating a partial detection area.
Figure 6:
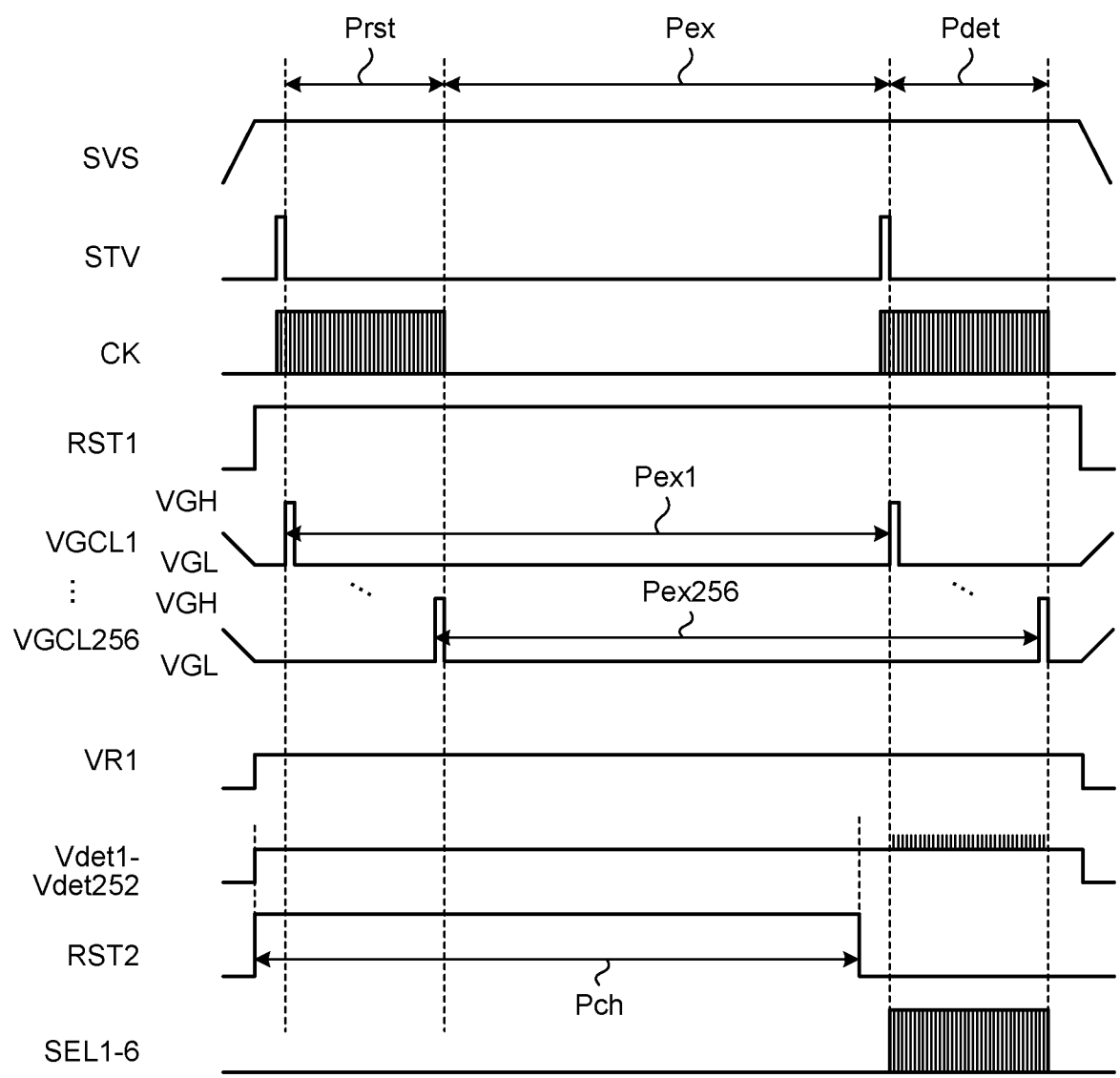
FIG. 6 is a timing waveform diagram illustrating an operation example of the detection device.

The following describes a circuit configuration example and an operation example of the detection device 1. FIG. 4 is a circuit diagram illustrating the detection device. FIG. 5 is a circuit diagram illustrating a partial detection area. FIG. 6 is a timing waveform diagram illustrating the operation example of the detection device.

As illustrated in FIG. 4, the sensor 10 has a plurality of partial detection areas PAA arranged in a matrix having a row-column configuration. As illustrated in FIG. 5, each of the partial detection areas PAA includes the first and the second photodiodes PD1 and PD2, a capacitive element Ca, and a first switching element Tr. The first switching element Tr is provided correspondingly to the first and the second photodiodes PD1 and PD2. The first switching element Tr is constituted by a thin-film transistor, and in this example, constituted by an re-channel metal oxide semiconductor (MOS) thin-film transistor (TFT).

The gates of the first switching element Tr are coupled to each of the gate lines GCL. The source of the first switching element Tr is coupled to each of the signal lines SGL. The drain of the first switching element Tr is coupled to a cathode electrode 34 of a corresponding one of the first photodiodes PD1, a cathode electrode 54 of a corresponding one of the second photodiodes PD2, and one end of the capacitive element Ca. An anode electrode 35 of the first photodiode PD1, an anode electrode 55 of the second photodiode PD2, and the other end of the capacitive element Ca are coupled to a reference potential, for example, a ground potential. In this way, the first and the second photodiodes PD1 and PD2 are coupled in parallel in the same direction to the first switching element Tr.

A third switching element TrS and a fourth switching element TrR are coupled to the signal line SGL. The third switching element TrS and the fourth switching element TrR are elements included in a drive circuit that drives the first switching element Tr. In the present embodiment, the drive circuit includes, for example, the gate line drive circuit 15, the signal line selection circuit 16, and a reset circuit 17 that are provided in the peripheral area GA. The third switching element TrS is constituted by, for example, a complementary metal-oxide semiconductor (CMOS) transistor obtained by combining a p-channel transistor p-TrS with an n-channel transistor n-TrS. In the same manner, the fourth switching element TrR is constituted by a CMOS transistor.

When the fourth switching element TrR of the reset circuit 17 is turned on, the capacitive element Ca is supplied with a reference signal VR1 serving as an initial potential of the capacitive element Ca from the power supply circuit 103. This operation resets the capacitive element Ca. When the partial detection area PAA is irradiated with light, a current corresponding to an amount of the light flows through each of the first and the second photodiodes PD1 and PD2. As a result, an electrical charge is stored in the capacitive element Ca. After the first switching element Tr is turned on, a current corresponding to the electrical charge stored in the capacitive element Ca flows through the signal line SGL. The signal line SGL is coupled to the AFE 48 through the third switching element TrS of the signal line selection circuit 16. Thus, the detection device 1 can detect a signal corresponding to the amount of the light emitted to the first and the second photodiodes PD1 and PD2 for each of the partial detection areas PAA.

As illustrated in FIG. 4, the gate lines GCL extend in a first direction Dx, and are coupled to the partial detection areas PAA arranged in the first direction Dx. A plurality of gate lines GCL1, GCL2, . . . , GCL8 are arranged in a second direction Dy, and are each coupled to the gate line drive circuit 15. In the following description, the gate lines GCL1, GCL2, . . . , GCL8 will each be simply referred to as the gate line GCL when need not be distinguished from one another. Although the number of the gate lines GCL is eight, this is merely an example. Eight or more, such as 256, of the gate lines GCL may be arranged.

The first direction Dx is a direction in a plane parallel to the insulating substrate 21, and is, for example, a direction parallel to the gate lines GCL. The second direction Dy is a direction in a plane parallel to the insulating substrate 21, and is, for example, a direction orthogonal to the first direction Dx. The second direction Dy may intersect the first direction Dx without being orthogonal thereto. A third direction Dz is a direction orthogonal to the first direction Dx and the second direction Dy, and is a direction orthogonal to the insulating substrate 21.

The signal lines SGL extend in the second direction Dy, and are coupled to the partial detection areas PAA arranged in the second direction Dy. A plurality of signal lines SGL1, SGL2, . . . , SGL12 are arranged in the first direction Dx, and are each coupled to the signal line selection circuit 16 and the reset circuit 17. Although the number of the signal lines SGL is 12, this is merely an example. Twelve or more, such as 252, of the signal lines SGL may be arranged. In FIG. 4, the sensor 10 is provided between the signal line selection circuit 16 and the reset circuit 17. The present disclosure is not limited thereto. The signal line selection circuit 16 and the reset circuit 17 may be coupled to the same ends of the signal lines SGL.

The gate line drive circuit 15 receives the various control signals such as the start signal STV, the clock signal CK, and the reset signal RST1 through a level shifter 151. The gate line drive circuit 15 includes a plurality of second switching elements TrG (not illustrated). The gate line drive circuit 15 sequentially selects the gate lines GCL1, GCL2, . . . , GCL8 in a time-division manner through operations of the second switching elements TrG. The gate line drive circuit 15 supplies the gate drive signal VGCL through a selected one of the gate lines GCL to corresponding ones of the first switching elements Tr. This operation selects the partial detection areas PAA arranged in the first direction Dx as the detection targets.

The signal line selection circuit 16 includes a plurality of selection signal lines Lsel, a plurality of output signal lines Lout, and the third switching elements TrS. The third switching elements TrS are provided correspondingly to the respective signal lines SGL. Six of the signal lines SGL1, SGL2, . . . , SGL6 are coupled to a common output signal line Lout1. Six of the signal lines SGL7, SGL8, . . . , SGL12 are coupled to a common output signal line Lout2. The output signal lines Lout1 and Lout2 are each coupled to the AFE 48.

The signal lines SGL1, SGL2, . . . , SGL6 are grouped into a first signal line block, and the signal lines SGL7, SGL8, . . . , SGL12 are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks. Specifically, selection signal lines Lsel1, Lsel2, . . . , Lsel6 are coupled to the third switching elements TrS corresponding to the signal lines SGL1, SGL2, . . . , SGL6. The selection signal line Lsel1 is coupled to one of the third switching elements TrS corresponding to the signal line SGL1 and one of the third switching elements TrS corresponding to the signal line SGL7. The selection signal line Lsel2 is coupled to one of the third switching elements TrS corresponding to the signal line SGL2 and one of the third switching elements TrS corresponding to the signal line SGL8.

The control circuit 102 (refer to FIG. 2) sequentially supplies the selection signals SEL to the selection signal lines Lsel through level shifters 161. This operation causes the signal line selection circuit 16 to operate the third switching elements TrS to sequentially select the signal lines SGL in one of the signal line blocks in a time-division manner. The signal line selection circuit 16 simultaneously selects one of the signal lines SGL in each of the signal line blocks. With the above-described configuration, the detection device 1 can reduce the number of integrated circuits (ICs) including the AFE 48 or the number of terminals of the ICs.

As illustrated in FIG. 4, the reset circuit 17 includes a reference signal line Lvr, a reset signal line Lrst, and the fourth switching elements TrR. The fourth switching elements TrR are provided correspondingly to the signal lines SGL. The reference signal line Lvr is coupled to either the sources or the drains of the fourth switching elements TrR. The reset signal line Lrst is coupled to the gates of the fourth switching elements TrR.

The control circuit 102 supplies a reset signal RST2 to the reset signal line Lrst through a level shifter 171. This operation turns on the fourth switching elements TrR to electrically couple the signal lines SGL to the reference signal line Lvr. The power supply circuit 103 supplies the reference signal VR1 to the reference signal line Lvr. This operation supplies the reference signal VR1 to the capacitive elements Ca included in the partial detection areas PAA.

As illustrated in FIG. 6, the detection device 1 includes a reset period Prst, an exposure period Pex, and a reading period Pdet. The power supply circuit 103 supplies the power supply signal SVS to the first and the second photodiodes PD1 and PD2 through the reset period Prst, the exposure period Pex, and the reading period Pdet. The control circuit 102 supplies the reference signal VR1 and the reset signal RST2 serving as high-level voltage signals to the reset circuit 17 from a time before the reset period Prst starts. The control circuit 102 supplies the start signal STV to the gate line drive circuit 15, and the reset period Prst starts.

During the reset period Prst, the gate line drive circuit 15 sequentially selects the gate line GCL based on the start signal STV, the clock signal CK, and the reset signal RST1. The gate line drive circuit 15 sequentially supplies the gate drive signal VGCL to the gate line GCL. The gate drive signal VGCL has a pulsed waveform having a high-level voltage VGH and a low-level voltage VGL. In FIG. 6, 256 of the gate lines GCL are provided, and gate drive signals VGCL1, . . . , VGCL256 are sequentially supplied to the gate lines GCL.

Thus, during the reset period Prst, the capacitive elements Ca of all the partial detection areas PAA are sequentially electrically coupled to the signal lines SGL, and are supplied with the reference signal VR1. As a result, capacities of the capacitive elements Ca are reset.

After the gate drive signal VGCL256 is supplied to the gate line GCL, the exposure period Pex starts. The start timing and end timing of actual exposure periods Pex1, . . . , Pex256 in the partial detection areas PAA corresponding to the respective gate lines GCL differ from one another. Each of the exposure periods Pex1, . . . , Pex256 starts at a time when the gate drive signal VGCL changes from the high-level voltage VGH to the low-level voltage VGL during the reset period Prst. Each of the exposure periods Pex1, . . . , Pex256 ends at a time when the gate drive signal VGCL changes from the low-level voltage VGL to the high-level voltage VGH during the reading period Pdet. The lengths of exposure time of the exposure periods Pex1, . . . , Pex256 are equal.

During the exposure period Pex, the current corresponding to the light emitted to the first and the second photodiodes PD1 and PD2 flows in each of the partial detection areas PAA. As a result, the electrical charge is stored in each of the capacitive elements Ca.

At a time before the reading period Pdet starts, the control circuit 102 sets the reset signal RST2 to a low-level voltage. This operation stops the reset circuit 17 operating. During the reading period Pdet, the gate line drive circuit 15 sequentially supplies the gate drive signals VGCL1, . . . , VGCL256 to the gate lines GCL in the same manner as during the reset period Prst.

For example, during a period in which the gate drive signal VGCL1 is at the high-level voltage VGH, the control circuit 102 sequentially supplies selection signals SEL1, . . . , SEL6 to the signal line selection circuit 16. This operation sequentially or simultaneously couples the signal lines SGL for the partial detection areas PAA selected by the gate drive signal VGCL1 to the AFE 48. As a result, the detection signal Vdet is supplied to the AFE 48. In the same manner, the signal line selection circuit 16 sequentially selects the signal line SGL in each period in which a corresponding one of the gate drive signals VGCL is set to the high-level voltage VGH. Thus, the detection device 1 can output the detection signals Vdet of all the partial detection areas PAA to the AFE 48 during the reading period Pdet.

The detection device 1 may perform the detection by repeatedly performing the processing during the reset period Prst, the exposure period Pex, and the reading period Pdet. Alternatively, the detection device 1 may start the detection operation when having detected that the finger Fg, for example, is in contact with or in proximity to the detection surface.

Figure 7:
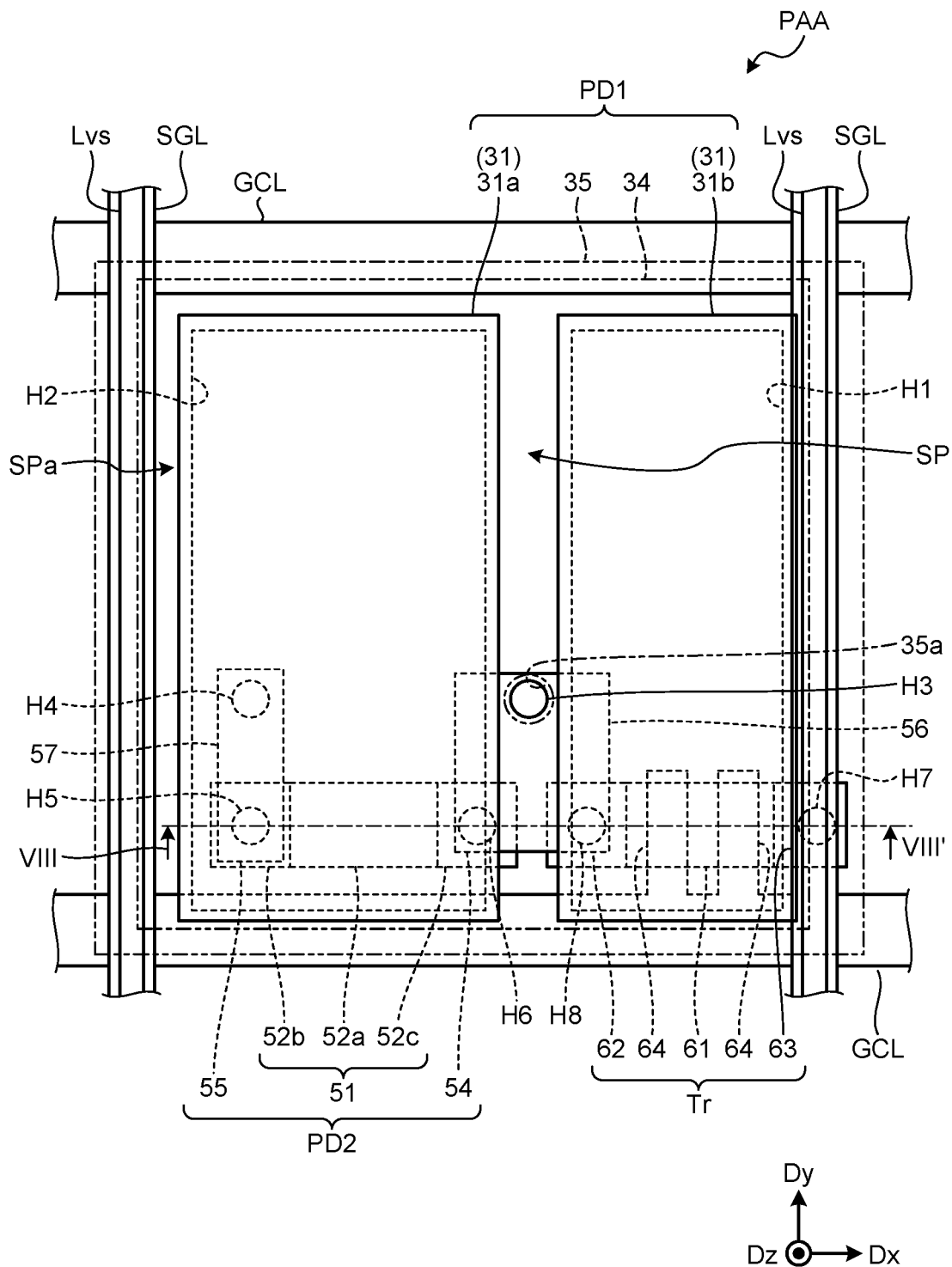
FIG. 7 is a plan view schematically illustrating the partial detection area of the detection device according to the first embodiment.
Figure 8:
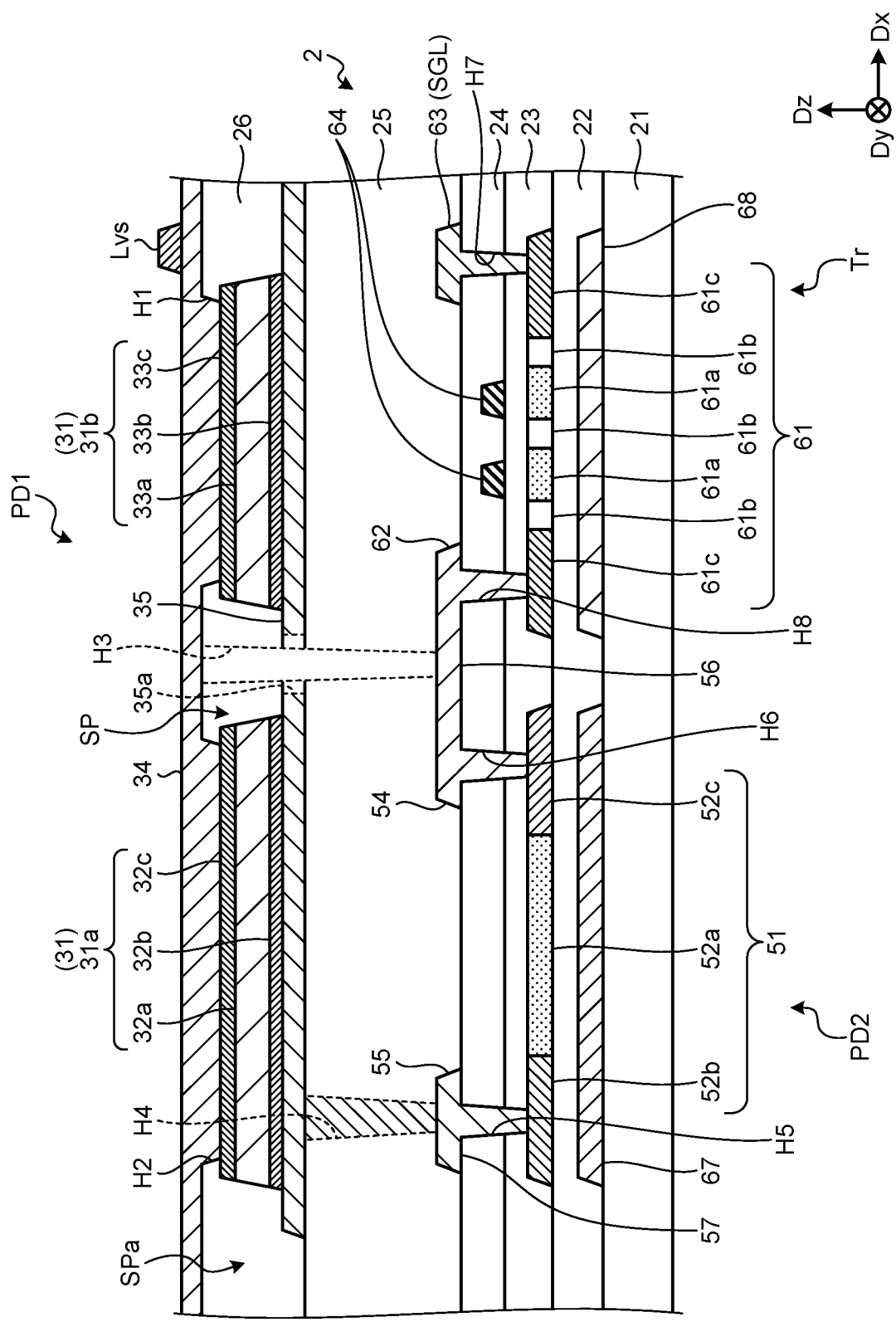
FIG. 8 is a VIII-VIII' sectional view of FIG. 7.

The following describes a detailed configuration of the detection device 1. FIG. 7 is a plan view schematically illustrating the partial detection area of the detection device according to the first embodiment. FIG. 8 is a VIII-VIII' sectional view of FIG. 7. For ease of viewing, FIG. 7 illustrates the cathode electrode 34 and the anode electrode 35 with long dashed double-short dashed lines.

In the following description, in a direction orthogonal to a surface of the insulating substrate 21, a direction from the insulating substrate 21 toward the first photodiode PD1 will be referred to as the "upper side" or simply as "above", and a direction from the first photodiode PD1 toward the insulating substrate 21 will be referred to as the "lower side" or simply as "below". The term "plan view" refers to a case of viewing from the direction orthogonal to the surface of the insulating substrate 21.

As illustrated in FIG. 7, the partial detection area PAA is an area surrounded by the gate lines GCL and the signal lines SGL. The first photodiode PD1, the second photodiode PD2, and the first switching element Tr are provided in the partial detection area PAA, that is, in the area surrounded by the gate lines GCL and the signal lines SGL. Each of the first and the second photodiodes PD1 and PD2 is, for example, a positive-intrinsic-negative (PIN) photodiode.

The first photodiode PD1 includes a first semiconductor layer 31, the cathode electrode 34 and the anode electrode 35. The first semiconductor layer 31 includes a first partial semiconductor layer 31*a* and a second partial semiconductor layer 31*b*. The first and the second partial semiconductor layers 31*a* and 31*b* of the first photodiode PD1 are of amorphous silicon (a-Si). The first and the second partial semiconductor layers 31*a* and 31*b* are provided adjacent to each other with a space SP provided therebetween in the first direction Dx. The cathode electrode 34 and the anode electrode 35 are continuously provided over an area overlapping the first partial semiconductor layer 31*a*, the second partial semiconductor layer 31*b*, and the space SP. In the following description, the first and the second partial semiconductor layers 31*a* and 31*b* may each be simply referred to as the first semiconductor layer 31 when need not be distinguished from one another.

The first photodiode PD1 is provided so as to overlap the second photodiode PD2. Specifically, the first partial semiconductor layer 31*a* of the first photodiode PD1 overlaps the second photodiode PD2. The second photodiode PD2 includes a second semiconductor layer 51, the cathode electrode 54, and the anode electrode 55. The second semiconductor layer 51 is of polysilicon. The second semiconductor layer 51 is more preferably of low-temperature polysilicon (hereinafter, referred to as low-temperature polycrystalline silicon (LIPS)).

The second semiconductor layer 51 has an i region 52*a*, a p region 52*b*, and an n region 52*c*. The i region 52*a* is disposed between the p region 52*b* and the n region 52*c* in plan view. Specifically, the p region 52*b*, the i region 52*a*, and the n region 52*c* are arranged in this order in the first direction Dx. The polysilicon of the n region 52*c* is doped with impurities to form an n+ region. The polysilicon of the p region 52*b* is doped with impurities to form a p+ region. The i region 52*a* is, for example, a non-doped intrinsic semiconductor, and has lower conductivity than those of the p region 52*b* and the n region 52*c*.

The second semiconductor layer 51 is coupled to the first partial semiconductor layer 31*a* of the first photodiode PD1 through a first relay electrode 56 and a second relay electrode 57. In the present embodiment, a portion of the first relay electrode 56 overlapping the second semiconductor layer 51 serves as the cathode electrode 54, and a portion of the second relay electrode 57 overlapping the second semiconductor layer 51 serves as the anode electrode 55. A detailed coupling configuration between the second semiconductor layer 51 and the first photodiode PD1 will be described later.

The first switching element Tr is provided in an area overlapping the second partial semiconductor layer 31*b* of the first photodiode PD1. The first switching element Tr includes a third semiconductor layer 61, a source electrode 62, a drain electrode 63, and gate electrodes 64. The third semiconductor layer 61 is of polysilicon in the same manner as the second semiconductor layer 51. The third semiconductor layer 61 is more preferably of LTPS.

In the present embodiment, a portion of the first relay electrode 56 overlapping the third semiconductor layer 61 serves as the source electrode 62, and a portion of the signal line SGL overlapping the third semiconductor layer 61 serves as the drain electrode 63. The gate electrodes 64 branch in the second direction Dy from the gate line GCL, and overlap the third semiconductor layer 61. In the present embodiment, the two gate electrodes 64 are provided so as to overlap the third semiconductor layer 61 to form what is called a double-gate structure.

The first switching element Tr is coupled to the cathode electrode 34 of the first photodiode PD1 and the cathode electrode 54 of the second photodiode PD2 through the first relay electrode 56. The first switching element Tr is also coupled to the signal line SGL.

More specifically, the first switching element Tr is provided on the insulating substrate 21 as illustrated in FIG. 8. The insulating substrate 21 is, for example, a light-transmitting glass substrate. The insulating substrate 21 may alternatively be a resin substrate or a resin film formed of a light-transmitting resin such as polyimide. In the detection device 1, the first photodiode PD1, the second photodiode PD2, and the first switching element Tr are formed above the insulating substrate 21. This configuration allows the detection device 1 to have an area of the detection area AA larger than that in a case of using a semiconductor substrate such as a silicon substrate.

Light-blocking layers 67 and 68 are provided above the insulating substrate 21. An undercoat film 22 is provided above the insulating substrate 21 so as to cover the light-blocking layers 67 and 68. The undercoat film 22, a gate insulating film 23, and a first interlayer insulating film 24 are inorganic insulating films, and are formed using, for example, a silicon oxide (SiO) film, a silicon nitride (SiN) film, or a silicon oxynitride (SiON) film. Each of the inorganic insulating films is not limited to a single layer, but may be a laminated film.

The second semiconductor layer 51 and the third semiconductor layer 61 are provided above the undercoat film 22. That is, the second semiconductor layer 51 of the second photodiode PD2 and the third semiconductor layer 61 of the first switching element Tr are provided in the same layer. The light-blocking layer 67 is provided between the second semiconductor layer 51 and the insulating substrate 21 in the third direction Dz. This configuration can restrain the light L1 from the lighting device 121 (refer to FIG. 1) from directly irradiating the second photodiode PD2. The light-blocking layer 68 is provided between the third semiconductor layer 61 and the insulating substrate 21 in the third direction Dz. This configuration can reduce a light leakage current of the first switching element Tr.

The third semiconductor layer 61 includes i regions 61a, lightly doped drain (LDD) regions 61b, and n regions 61c. The i regions 61a are formed in areas overlapping the respective gate electrodes 64. The n regions 61c are high-concentration impurity regions that are formed in areas coupled to the source electrode 62 and the drain electrode 63. The LDD regions 61b are low-concentration impurity regions that are formed between the n regions 61c and the i regions 61a and between the two i regions 61a.

The gate insulating film 23 is provided above the undercoat film 22 so as to cover the second semiconductor layer 51 and the third semiconductor layer 61. The gate electrodes 64 are provided above the gate insulating film 23. That is, the first switching element Tr has what is called a top-gate structure in which the gate electrodes 64 are provided on the upper side of the third semiconductor layer 61. However, the first switching element Tr may have what is called a dual-gate structure in which the gate electrodes 64 are provided on both the upper side and the lower side of the third semiconductor layer 61, or may have a bottom-gate structure in which the gate electrodes 64 are provided on the lower side of the third semiconductor layer 61.

The first interlayer insulating film 24 is provided above the gate insulating film 23 so as to cover the gate electrodes 64. The first interlayer insulating film 24 is also provided on the upper side of the second semiconductor layer 51. The first relay electrode 56, the second relay electrode 57, and the signal line SGL are provided above the first interlayer insulating film 24. In the first switching element Tr, the source electrode 62 (first relay electrode 56) is coupled to the third semiconductor layer 61 through a contact hole H8, and the drain electrode 63 (signal line SGL) is coupled to the third semiconductor layer 61 through a contact hole H7.

In the second photodiode PD2, the cathode electrode 54 (first relay electrode 56) is coupled to the n region 52c of the second semiconductor layer 51 through a contact hole H6. This configuration couples the cathode electrode 54 of the second photodiode PD2 to the first switching element Tr. The anode electrode 55 (second relay electrode 57) is coupled to the p region 52b of the second semiconductor layer 51 through a contact hole H5.

A second interlayer insulating film 25 is provided above the first interlayer insulating film 24 so as to cover the second photodiode PD2 and the first switching element Tr. The second interlayer insulating film 25 is an organic film, and is a planarizing film that planarizes asperities formed by various conductive layers. The second interlayer insulating film 25 may be formed of one of the above-mentioned inorganic materials.

The anode electrode 35 of the first photodiode PD1 is provided above the second interlayer insulating film 25 of a backplane 2. The anode electrode 35, the first and the second partial semiconductor layers 31a and 31b, and the cathode electrode 34 are stacked in this order to form the first photodiode PD1. The backplane 2 is a drive circuit board that drives the sensor on a per predetermined detection area basis. The backplane 2 includes the insulating substrate 21, and the first switching elements Tr, the second switching elements TrG, various types of wiring, and so forth provided on the insulating substrate 21.

The first partial semiconductor layer 31a includes an i-type semiconductor layer 32a, a p-type semiconductor layer 32b, and an n-type semiconductor layer 32c. The second partial semiconductor layer 31b includes an i-type semiconductor layer 33a, a p-type semiconductor layer 33b, and an n-type semiconductor layer 33c. The i-type semiconductor layers 32a, 33a, the p-type semiconductor layers 32b, 33b, and the n-type semiconductor layers 32c, 33c are specific examples of the photoelectric conversion elements. In FIG. 8, the i-type semiconductor layers 32a, 33a are provided between the p-type semiconductor layers 32b, 33b and the n-type semiconductor layers 32c, 33c in the direction (third direction Dz) orthogonal to the surface of the insulating substrate 21. In the present embodiment, the p-type semiconductor layers 32b, 33b, the i-type semiconductor layers 32a, 33a, and the n-type semiconductor layers 32c, 33c are stacked in this order above the anode electrode 35.

In the n-type semiconductor layers 32c, 33c, a-Si is doped with impurities to form the n+ regions. In the p-type semiconductor layers 32b, 33b, a-Si is doped with impurities to form the p+ regions. The i-type semiconductor layers 32a, 33a are, for example, non-doped intrinsic semiconductors, and have lower conductivity than those of the n-type semiconductor layers 32c, 33c and the p-type semiconductor layers 32b, 33b.

The cathode electrode 34 and the anode electrode 35 are of a light-transmitting conductive material such as indium tin oxide (ITO). The cathode electrode 34 is an electrode for supplying the power supply signal SVS to the photoelectric conversion layer. The anode electrode 35 is an electrode for reading the detection signal Vdet.

The anode electrode 35 is provided above the second interlayer insulating film 25. The anode electrode 35 is continuously provided across the first and the second partial semiconductor layers 31a and 31b. The anode electrode 35 is coupled to the second relay electrode 57 through a contact hole H4 provided in the second interlayer insulating film 25.

A third interlayer insulating film 26 is provided so as to cover the first and the second partial semiconductor layers 31a and 31b. The third interlayer insulating film 26 is an organic film, and is a planarizing film that planarizes asperities formed by the first and the second partial semiconductor layers 31a and 31b. The cathode electrode 34 is provided above the third interlayer insulating film 26. The cathode electrode 34 is continuously provided above the first and the second partial semiconductor layers 31a and 31b. The cathode electrode 34 is coupled to the first and the second partial semiconductor layers 31a and 31b through contact holes H2 and H1 provided in the third interlayer insulating film 26. With this configuration, the first and the second partial semiconductor layers 31a and 31b are coupled in parallel between the anode electrode 35 and the cathode electrode 34, and serve as one photoelectric conversion element.

The cathode electrode 34 is coupled to the first relay electrode 56 through a contact hole H3 in the space SP between the first and the second partial semiconductor layers 31a and 31b. The contact hole H3 is a through-hole passing through the second interlayer insulating film 25 and the third interlayer insulating film 26 in the third direction Dz. An opening 35a is provided at a portion of the anode electrode 35 overlapping the contact hole H3, and the contact hole H3 is formed through the opening 35a. With the above-described configuration, the cathode electrode 34 of the first photodiode PD1 and the cathode electrode 54 of the second photodiode PD2 are coupled to the first switching element Tr through the first relay electrode 56. In addition, the anode electrode 35 of the first photodiode PD1 is couple to the anode electrode 55 of the second photodiode PD2 through the second relay electrode 57.

The capacity of the capacitive element Ca illustrated in FIG. 5 is provided in the space SP located between the anode electrode 35 and the cathode electrode 34 facing each other with the third interlayer insulating film 26 interposed therebetween, or is provided in a space SPa at the periphery of the first photodiode PD1 located between the anode electrode 35 and the cathode electrode 34 facing each other with the third interlayer insulating film 26 interposed therebetween. The capacitive element Ca stores therein a positive electrical charge during the exposure period Pex.

Figure 9:
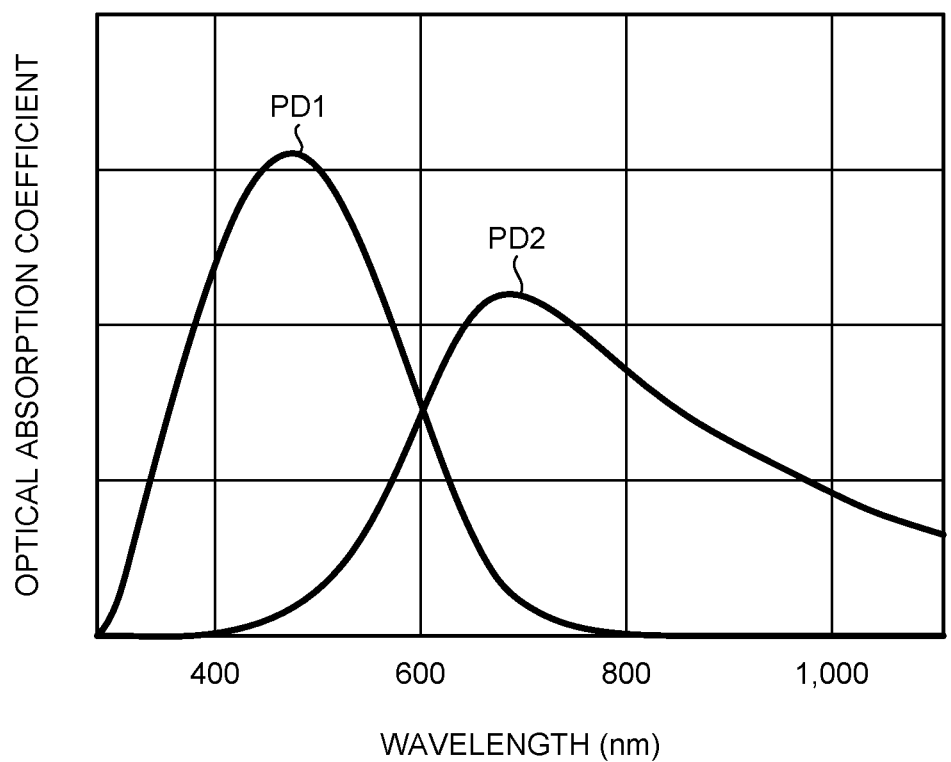
FIG. 9 is a graph schematically illustrating a relation between a wavelength and an optical absorption coefficient of each of a first photodiode and a second photodiode.

FIG. 9 is a graph schematically illustrating a relation between a wavelength and an optical absorption coefficient of each of the first photodiode and the second photodiode. In FIG. 9, the horizontal axis represents the wavelength, and the vertical axis represents the optical absorption coefficient. The optical absorption coefficient is an optical constant that represents a degree of absorption of light traveling through a substance.

As illustrated in FIG. 9, the first photodiode PD1 containing a-Si exhibits a good optical absorption coefficient in the visible light range, for example, in a wavelength range from 300 nm to 800 nm. In contrast, the second photodiode PD2 containing polysilicon exhibits a good optical absorption coefficient in a range of, for example, from 500 nm to 1100 nm, including visible to infrared ranges. In other words, the first photodiode PD1 has high sensitivity in the visible light range, and the second photodiode PD2 has high sensitivity in a range from the red wavelength range to the infrared range that differs from the range of the first photodiode PD1.

In the detection device 1 of the present embodiment, the first and the second photodiodes PD1 and PD2 having different sensitive wavelength ranges are stacked. With this configuration, the wavelength range having high sensitivity can be wider than in a configuration including only either of the photodiodes.

The light L1 (refer to FIG. 1) penetrates the detection device 1 through the space SP and the space SPa. The light L2 reflected by the finger Fg (refer to FIG. 1) enters the first photodiode PD1. Of the light L2, light in a wavelength range not absorbed by the first photodiode PD1 passes through the first photodiode PD1, and enters the second photodiode PD2. For example, in the fingerprint detection, the first photodiode PD1 can well detect the blue or green light L2. In the vein detection, the infrared light L2 is not absorbed by the first photodiode PD1, and enters the second photodiode PD2. Thus, the second photodiode PD2 can well detect the infrared light L2. As a result, the detection device 1 can detect the various types of biological information using the same device (detection device 1).

Even if the i region 52a of the second photodiode PD2 has changed to the n-type under the influence of electrical charges or impurities of the insulating films including, for example, the first interlayer insulating film 24, the i region 52a is neutralized by the cathode electrode 34 of the first photodiode PD1. As a result, the detection device 1 can be increased in optical sensitivity.

The first and the second photodiodes PD1 and PD2 are provided in the partial detection area PAA, that is, in the area surrounded by the gate lines GCL and the signal lines SGL. With this configuration, the number of switching elements and the number of wires can be smaller than in a case where each of the first and the second photodiodes PD1 and PD2 is provided with the first switching element Tr, the gate line GCL, and the signal line SGL. Accordingly, the detection device 1 can improve the resolution of the detection.

The detection device 1 is not limited to the case of being used as the fingerprint sensor for detecting the fingerprint of the finger Fg and the sensor for detecting the veins. The detection device 1 can also be used as a biosensor for detecting various types of biological information such as the blood vessel image of the finger Fg or the palm, the pulse wave, the pulsation, and a blood oxygen concentration.

Figure 10:
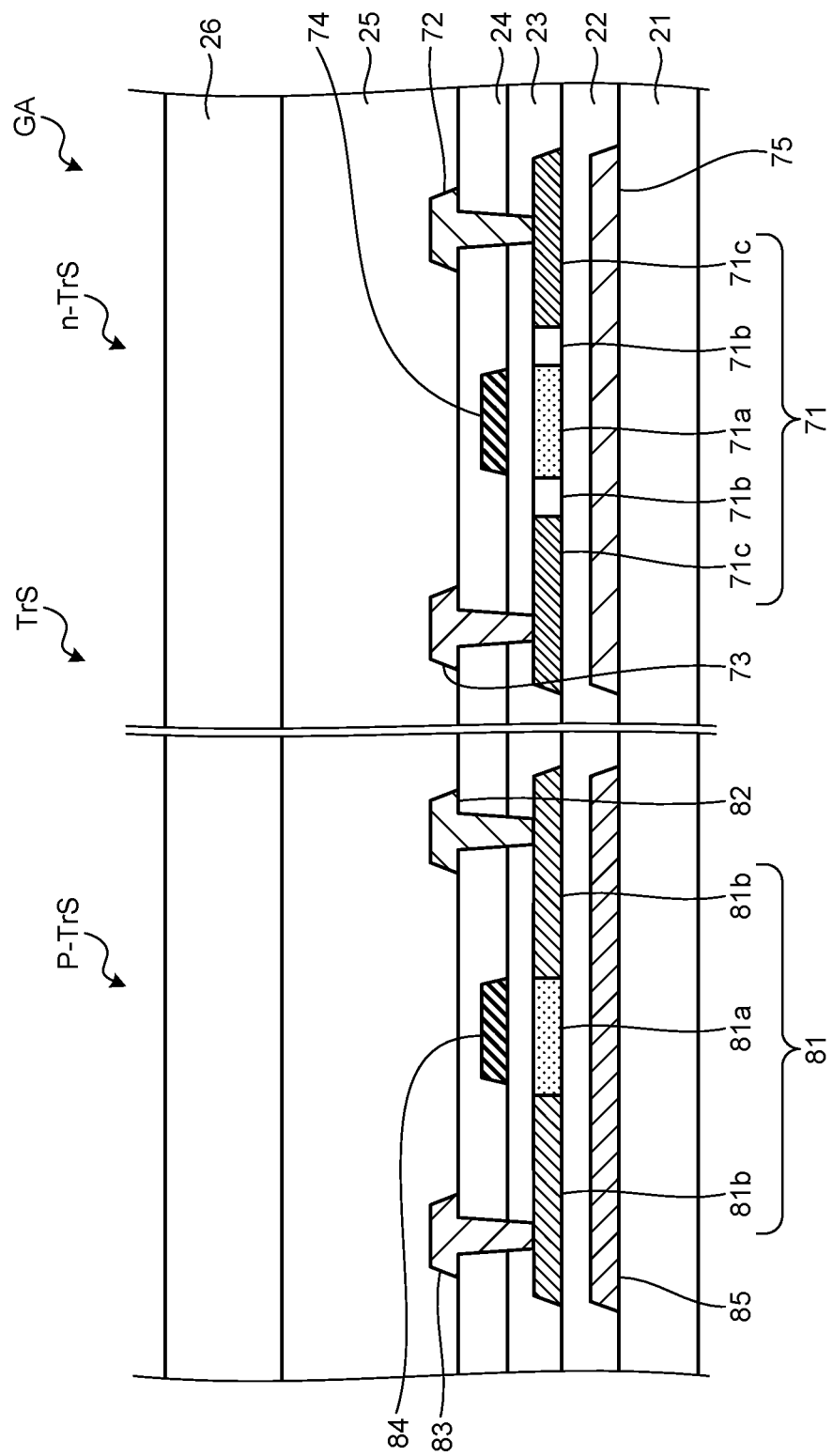
FIG. 10 is a sectional view illustrating a schematic sectional configuration of a switching element included in a drive circuit.

FIG. 10 is a sectional view illustrating a schematic sectional configuration of the switching element included in the drive circuit. FIG. 10 explains the third switching element TrS included as a drive circuit switching element in the signal line selection circuit 16. However, the explanation of FIG. 10 can also be applied to switching elements included in other drive circuits. That is, the same configuration as that of FIG. 10 can be applied to the second switching elements TrG included in the gate line drive circuit 15 and the fourth switching element TrR included in the reset circuit 17.

As illustrated in FIG. 10, the n-channel transistor n-TrS of the third switching element TrS includes a fourth semiconductor layer 71, a source electrode 72, a drain electrode 73, and a gate electrode 74. The p-channel transistor p-TrS includes a fifth semiconductor layer 81, a source electrode 82, a drain electrode 83, and a gate electrode 84. A light-blocking layer 75 is provided between the fourth semiconductor layer 71 and the insulating substrate 21. A light-blocking layer 85 is provided between the fifth semiconductor layer 81 and the insulating substrate 21.

Both the fourth semiconductor layer 71 and the fifth semiconductor layer 81 are of polysilicon. The fourth semiconductor layer 71 and the fifth semiconductor layer 81 are more preferably of LTPS. The fourth semiconductor layer 71 includes an i region 71a, LDD regions 71b, and the n regions 71c. The fifth semiconductor layer 81 includes an i region 81a and p regions 81b.

The n-channel transistor n-TrS and the p-channel transistor p-TrS have the same layer configuration as that of the first switching element Tr illustrated in FIG. 8. That is, the fourth semiconductor layer 71 and the fifth semiconductor layer 81 are provided in the same layer as those of the second semiconductor layer 51 and the third semiconductor layer 61 illustrated in FIG. 8; the gate electrode 74 and the gate electrode 84 are provided in the same layer as those of the gate electrodes 64 illustrated in FIG. 8; and the source electrode 72, the drain electrode 73, the source electrode 82, and the drain electrode 83 are provided in the same layer as those of the source electrode 62 (first relay electrode 56) and the drain electrode 63 (signal line SGL) illustrated in FIG. 8.

As described above, the second photodiode PD2 and the first switching element Tr provided in the detection area AA use the same material and are provided in the same layer as the switching elements are, such as the third switching element TrS provided in the peripheral area GA. This configuration can simplify the manufacturing process and reduce the manufacturing cost of the detection device 1. The drive circuit provided in the peripheral area GA is not limited to being constituted by the CMOS transistor, and may be constituted by either the n-channel transistor n-TrS or the p-channel transistor p-TrS.

First Modification of First Embodiment

Figure 11:
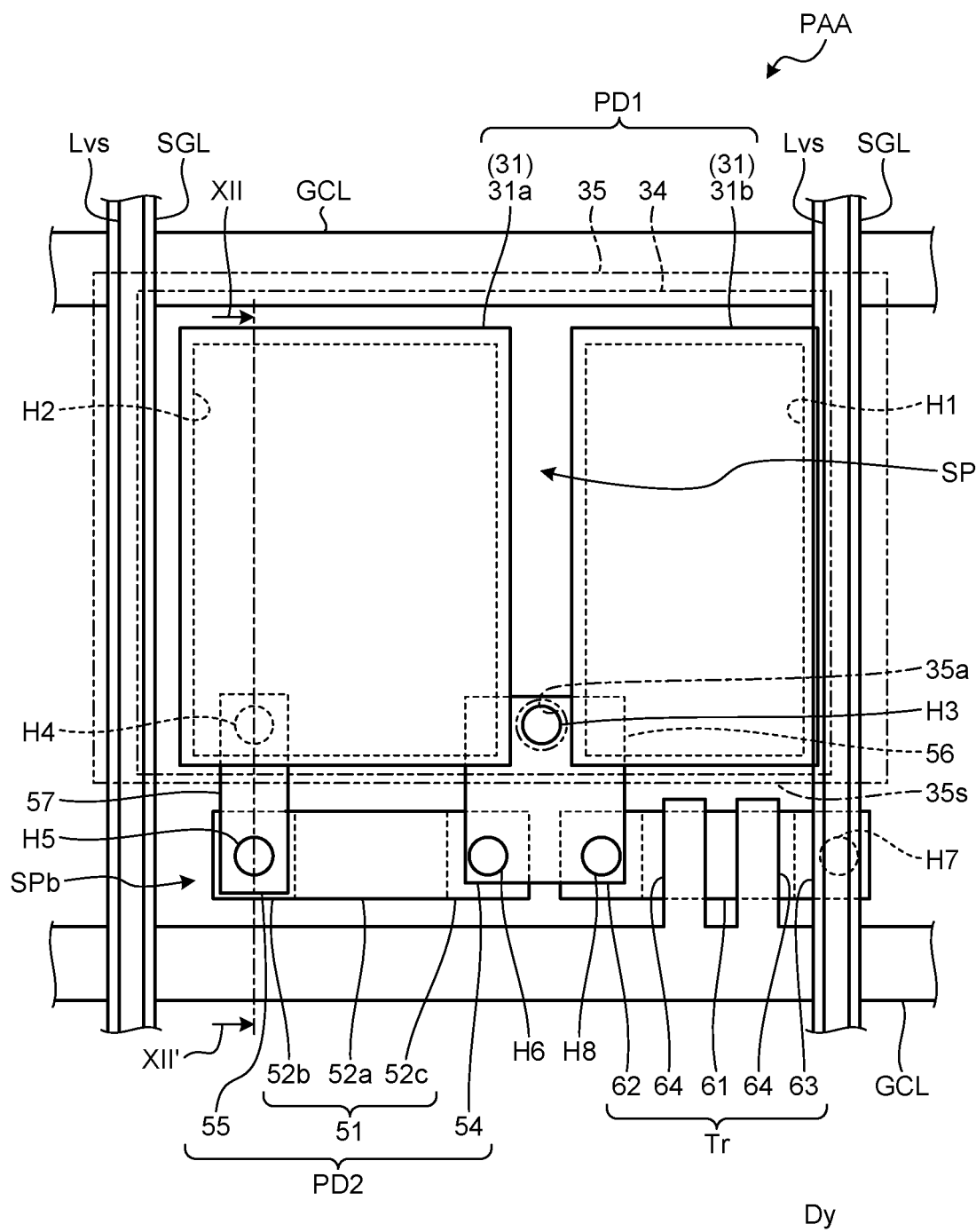
FIG. 11 is a plan view schematically illustrating the partial detection area of the detection device according to a first modification of the first embodiment.

FIG. 11 is a plan view schematically illustrating the partial detection area of the detection device according to a first modification of the first embodiment. The same components as those described in the above-described first embodiment are denoted by the same reference numerals, and the description of the same components will not be repeated. As illustrated in FIG. 11, the first modification differs from the above-described first embodiment in configuration in which the first photodiode PD1 is provided adjacent to the second photodiode PD2 in plan view.

As illustrated in FIG. 11, the first photodiode PD1 is disposed away from the gate line GCL in the second direction Dy. Specifically, one side 35s of the anode electrode 35 of the first photodiode PD1 is disposed away from the gate line GCL in the second direction Dy in plan view, and a space SPb is provided between the one side 35s of the anode electrode 35 and the gate line GCL. The one side 35s is a side closer to the second photodiode PD2 among sides of the anode electrode 35 along the first direction Dx.

The second photodiode PD2 and the first switching element Tr are provided between the first photodiode PD1 and the gate line GCL that are adjacent in the second direction Dy. Each of the first relay electrode 56 and the second relay electrode 57 has a portion overlapping the anode electrode 35 of the first photodiode PD1 and a portion not overlapping the anode electrode 35 of the first photodiode PD1. The first photodiode PD1, the second photodiode PD2, and the first switching element Tr are coupled to one another through the first relay electrode 56 and the second relay electrode 57 in the same manner as in the first embodiment.

Figure 12:
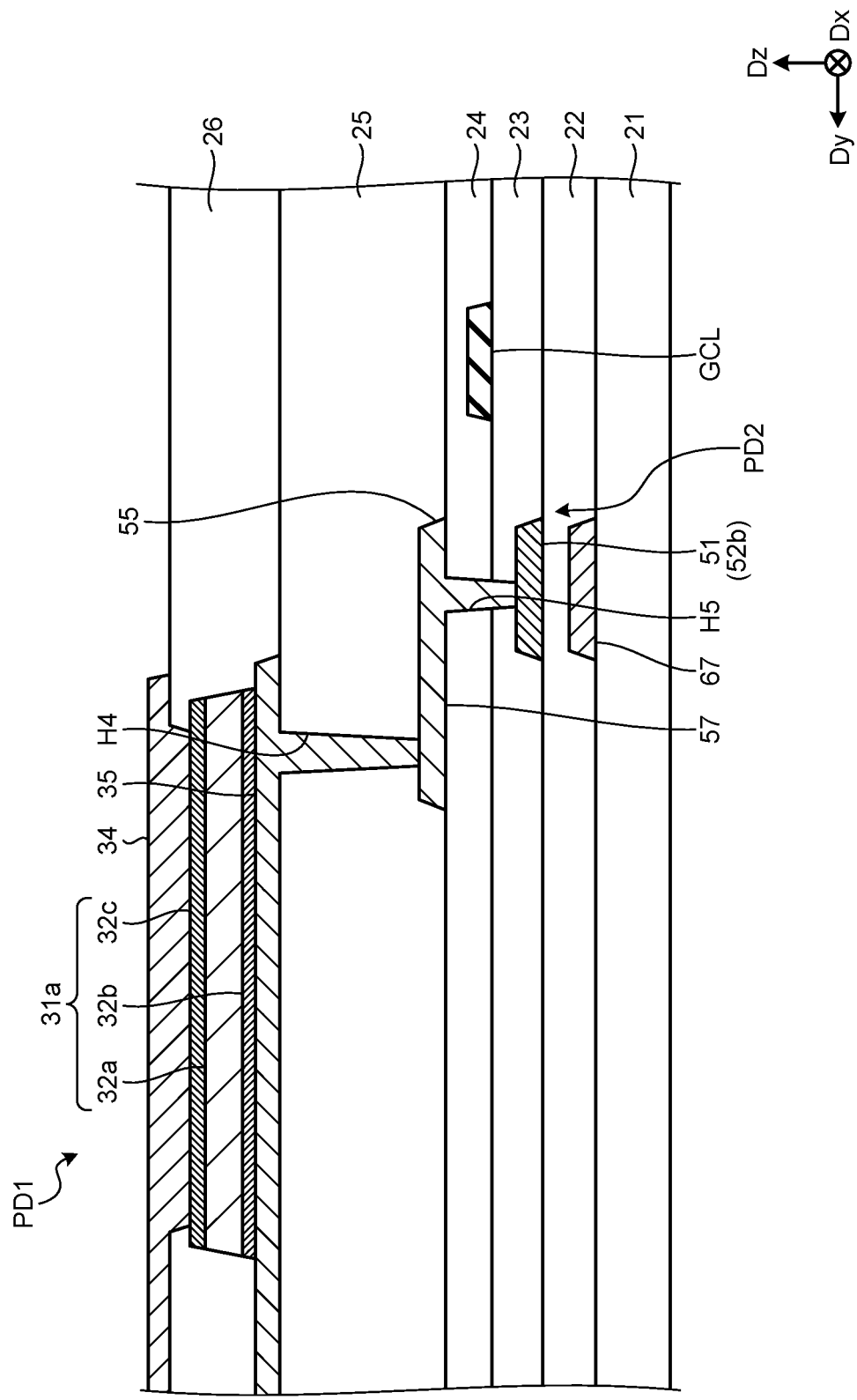
FIG. 12 is a XII-XII' sectional view of FIG. 11.

As illustrated in FIG. 12, the second photodiode PD2 is provided in an area not overlapping the first photodiode PD1. That is, the second interlayer insulating film 25 and the third interlayer insulating film 26 are stacked above the anode electrode 55 of the second photodiode PD2, and the second semiconductor layer 51 is not provided between the insulating substrate 21 and the first photodiode PD1 in the third direction Dz.

With such a configuration, in the first modification, the light L2 reflected by the finger Fg enters the second photodiode PD2 without passing through the first photodiode PD1. As a result, the intensity of the light L2 incident on the second photodiode PD2 is higher than that in the first embodiment, thus increasing the light usage efficiency of the second photodiode PD2.

Second Embodiment

Figure 13:
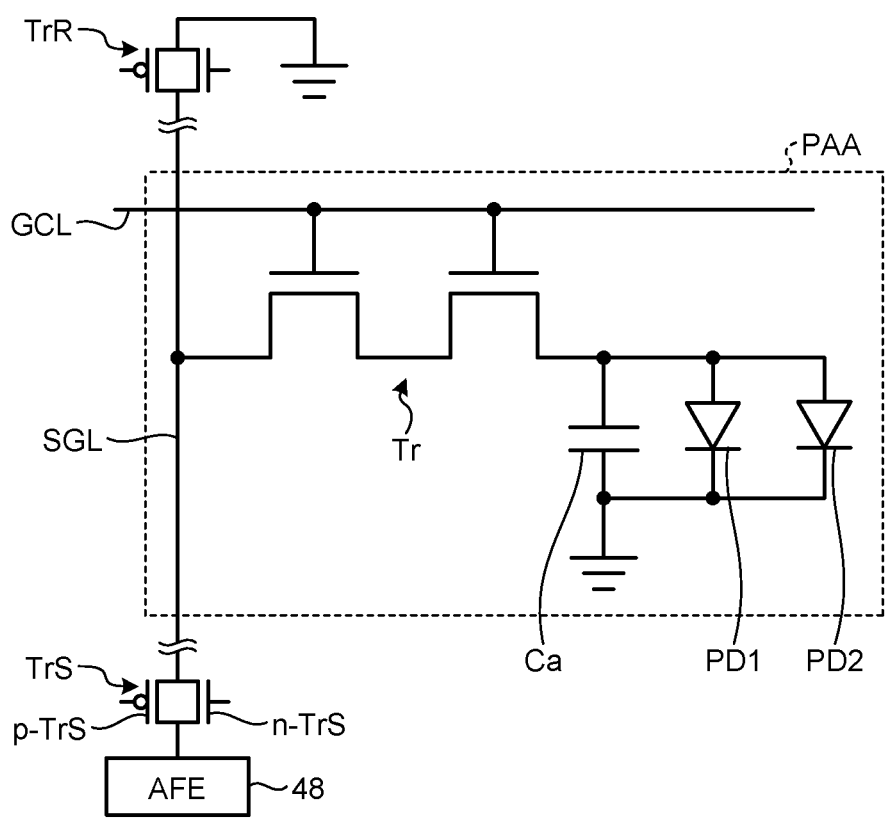
FIG. 13 is a circuit diagram illustrating the partial detection area according to a second embodiment of the present disclosure.
Figure 14:
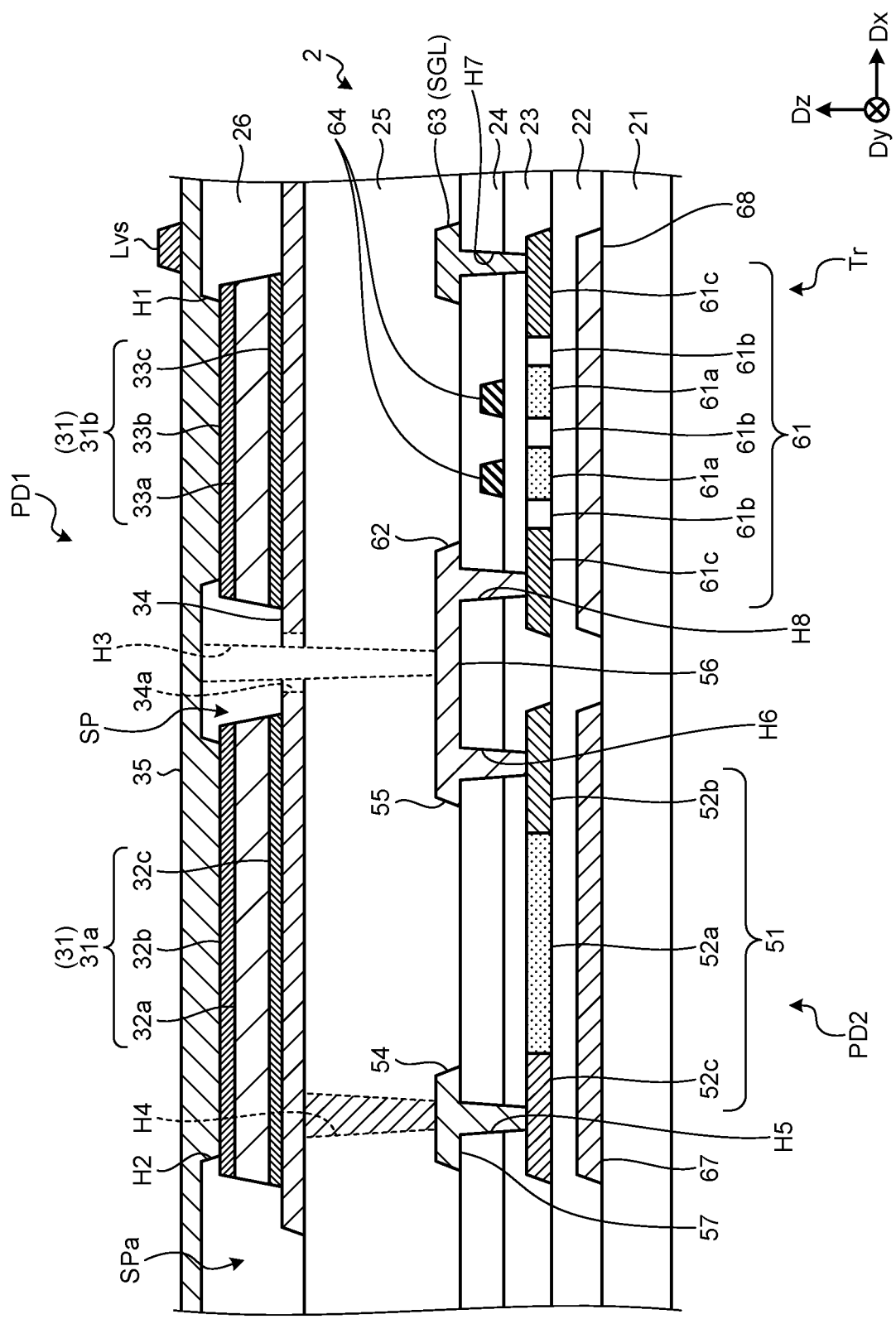
FIG. 14 is a sectional view illustrating a schematic sectional configuration of the detection device according to the second embodiment.

FIG. 13 is a circuit diagram illustrating the partial detection area according to a second embodiment of the present disclosure. FIG. 14 is a sectional view illustrating a schematic sectional configuration of the detection device according to the second embodiment. As illustrated in FIG. 13, the anode electrode 35 of the first photodiode PD1 and the anode electrode 55 of the second photodiode PD2 are coupled to the first switching element Tr. The cathode electrode 34 of the first photodiode PD1 and the cathode electrode 54 of the second photodiode PD2 are coupled to the reference potential, for example, the ground potential. That is, in the second embodiment, the first and the second photodiodes PD1 and PD2 are coupled in parallel to the first switching element Tr in a direction opposite to that in the first embodiment.

As illustrated in FIG. 14, the cathode electrode 34 of the first photodiode PD1 is provided above the second interlayer insulating film 25. The cathode electrode 34, the first and the second partial semiconductor layers 31a and 31b, and the anode electrode 35 are stacked in this order to form the first photodiode PD1. The n-type semiconductor layers 32c, 33c, the i-type semiconductor layers 32a, 33a, and the p-type semiconductor layers 32b, 33b are stacked in this order in the third direction Dz to form the first and the second partial semiconductor layers 31a and 31b above the cathode electrode 34.

The anode electrode 35 is provided above the first and the second partial semiconductor layers 31a and 31b. The anode electrode 35 is coupled to the first relay electrode 56 through the contact hole H3 in the space SP between the first and the second partial semiconductor layers 31a and 31b. In this case, an opening 34a is formed in an area of the cathode electrode 34 overlapping the contact hole H3. The cathode electrode 34 is coupled to the second relay electrode 57 through the contact hole H4.

In the second semiconductor layer 51 of the second photodiode PD2, the n region 52c, the i region 52a, and the p region 52b are arranged in this order in the first direction Dx. A portion of the first relay electrode 56 overlapping the second semiconductor layer 51 serves as the anode electrode 55. A portion of the second relay electrode 57 overlapping the second semiconductor layer 51 serves as the cathode electrode 54. The anode electrode 55 (first relay electrode 56) is coupled to the p region 52b of the second semiconductor layer 51 through the contact hole H6. The cathode electrode 54 (second relay electrode 57) is coupled to the n region 52c of the second semiconductor layer 51 through the contact hole H5.

With the above-described configuration, the cathode electrode 34 of the first photodiode PD1 is coupled to the cathode electrode 54 of the second photodiode PD2 through the second relay electrode 57. In addition, the anode electrode 35 of the first photodiode PD1 and the anode electrode 55 of the second photodiode PD2 are coupled to the first switching element Tr through the first relay electrode 56.

In the present embodiment, the capacitive element Ca stores therein a negative electrical charge during the exposure period Pex. Also in the second embodiment, the detection device 1 can widen the wavelength range having high sensitivity in the same manner as in the first embodiment. The planar configuration of the second embodiment is similar to that of FIG. 7, and therefore, is not illustrated. Specifically, the planar configuration of the second embodiment is obtained by interchanging the cathode electrode 34 of the first photodiode PD1 with the anode electrode 35, and interchanging the cathode electrode 54 and the n region 52c of the second photodiode PD2 with the anode electrode 55 and the p region 52b, in FIG. 7. The configuration of the first modification can also be applied to the second embodiment.

Third Embodiment

Figure 15:
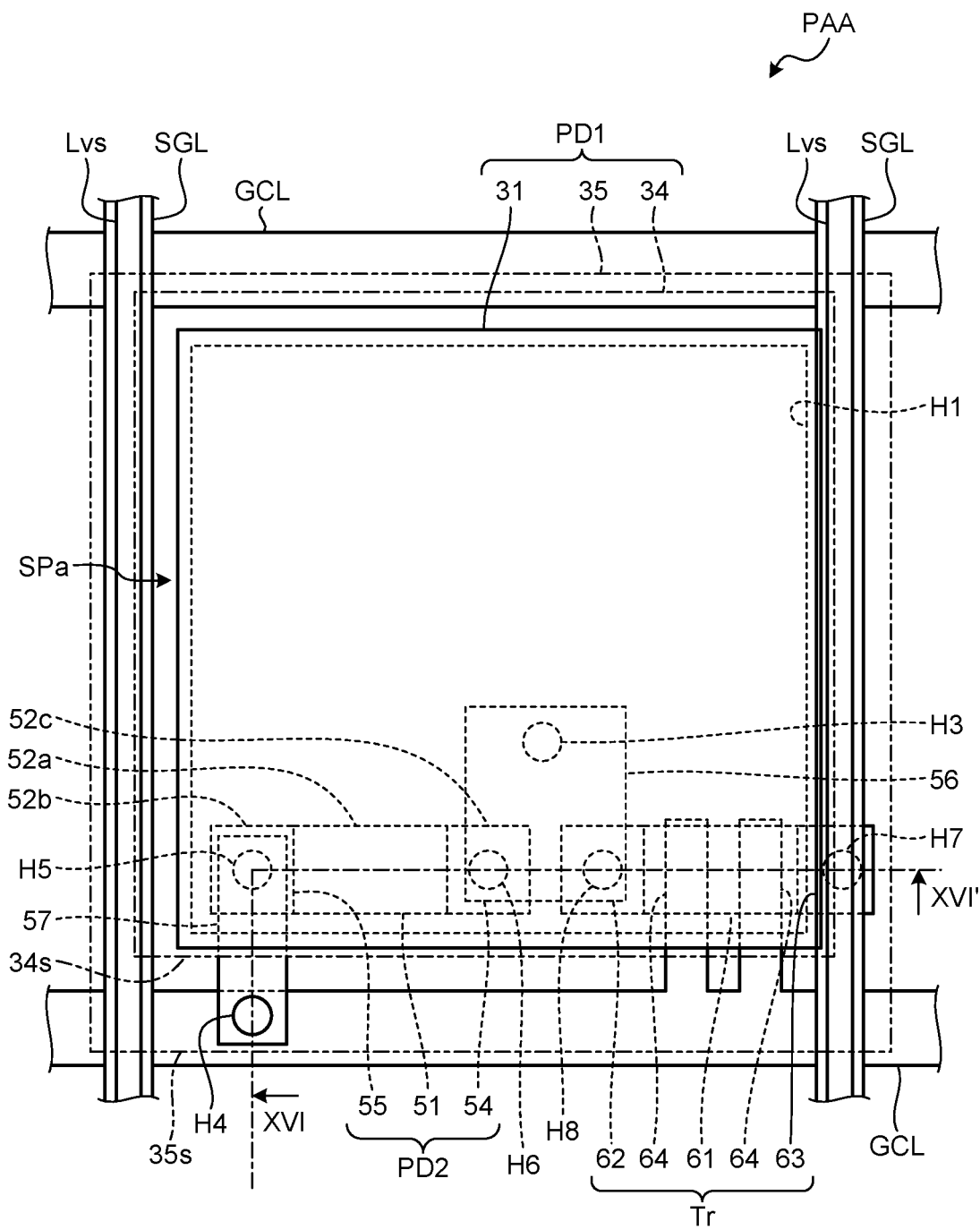
FIG. 15 is a plan view schematically illustrating the partial detection area of the detection device according to a third embodiment of the present disclosure.
Figure 16:
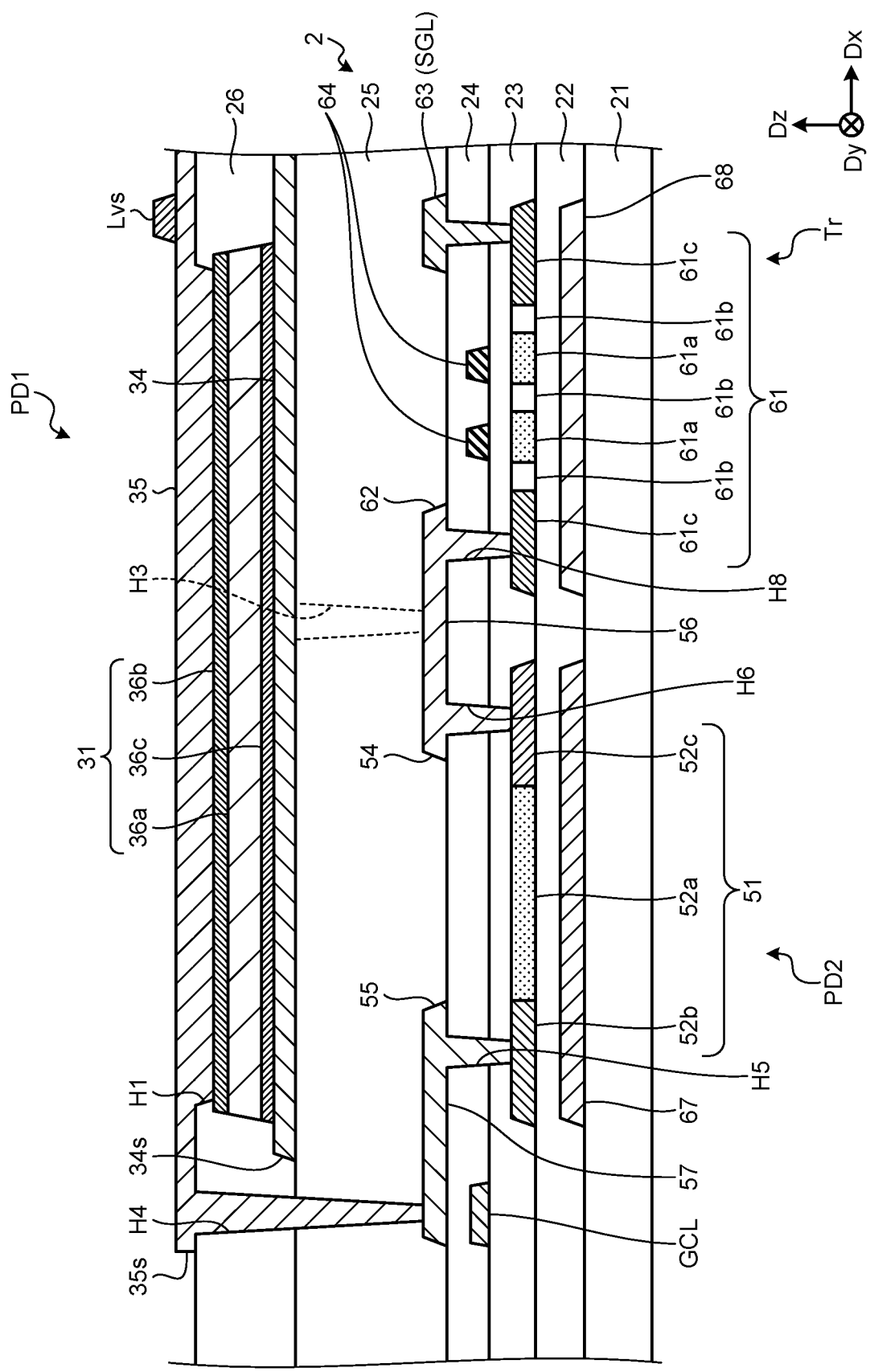
FIG. 16 is a XVI-XVI' sectional view of FIG. 15.

FIG. 15 is a plan view schematically illustrating the partial detection area of the detection device according to a third embodiment of the present disclosure. FIG. 16 is a XVI-XVI' sectional view of FIG. 15. As illustrated in FIG. 15, the first photodiode PD1 includes the single first semiconductor layer 31. The anode electrode 35 has a portion projecting outside the outer circumference of the cathode electrode 34 near a portion of the anode electrode 35 overlapping the second photodiode PD2. Specifically, one side 34s of the cathode electrode 34 is disposed away from the gate line GCL in the second direction Dy. The one side 35s of the anode electrode 35 is disposed in a position overlapping the gate line GCL. The anode electrode 35 is coupled to the second relay electrode 57 in an area overlapping the gate line GCL, that is, in an area between the one side 34s of the cathode electrode 34 and the one side 35s of the anode electrode 35.

The second photodiode PD2 and the first switching element Tr are provided in areas overlapping the first photodiode PD1. The configuration in plan view of the second photodiode PD2 and the first switching element Tr is the same as that in the first embodiment.

As illustrated in FIG. 16, the cathode electrode 34, the first semiconductor layer 31, and the anode electrode 35 are stacked in this order to form the first photodiode PD1 above the second interlayer insulating film 25. The first semiconductor layer 31 includes an i-type semiconductor layer 36a, a p-type semiconductor layer 36b, and an n-type semiconductor layer 36c. The n-type semiconductor layer 36c, the i-type semiconductor layer 36a, and the p-type semiconductor layer 36b are stacked in this order in the third direction Dz above the cathode electrode 34.

The cathode electrode 34 is coupled to the first relay electrode 56 through the contact hole H3. The contact hole H3 is formed so as to penetrate the second interlayer insulating film 25 in the third direction Dz. The second relay electrode 57 extends from an area overlapping the second semiconductor layer 51 to an area overlapping the gate line GCL. In other words, the second relay electrode 57 includes a portion overlapping the second semiconductor layer 51 and a portion overlapping the gate line GCL. The anode electrode 35 is coupled to a portion of the second relay electrode 57 overlapping the gate line GCL through the contact hole H4. The contact hole H4 is formed so as to penetrate the second interlayer insulating film 25 and the third interlayer insulating film 26 in the third direction Dz. The second photodiode PD2 has the same stacking configuration as that of the first embodiment illustrated in FIG. 8.

With the above-described configuration, the cathode electrode 34 of the first photodiode PD1 and the cathode electrode 54 of the second photodiode PD2 are coupled to the first switching element Tr through the first relay electrode 56. In addition, the anode electrode 35 of the first photodiode PD1 is coupled to the anode electrode 55 of the second photodiode PD2 through the second relay electrode 57. That is, the circuit configuration of the third embodiment is the same as that of FIG. 5 for the first embodiment.

In the third embodiment, the first photodiode PD1 is constituted by the single first semiconductor layer 31, and does not have the space SP illustrated in FIG. 8. This configuration can increase an area of the first photodiode PD1 that can receive the light L2, and therefore, increases the light usage efficiency of the first photodiode PD1. The capacity of the capacitive element Ca is provided between the cathode electrode 34 and the anode electrode 35 facing each other, for example, in the space SPa between the outer circumference of the first semiconductor layer 31 and the signal line SGL illustrated in FIG. 7.

Second Modification of Third Embodiment

Figure 17:
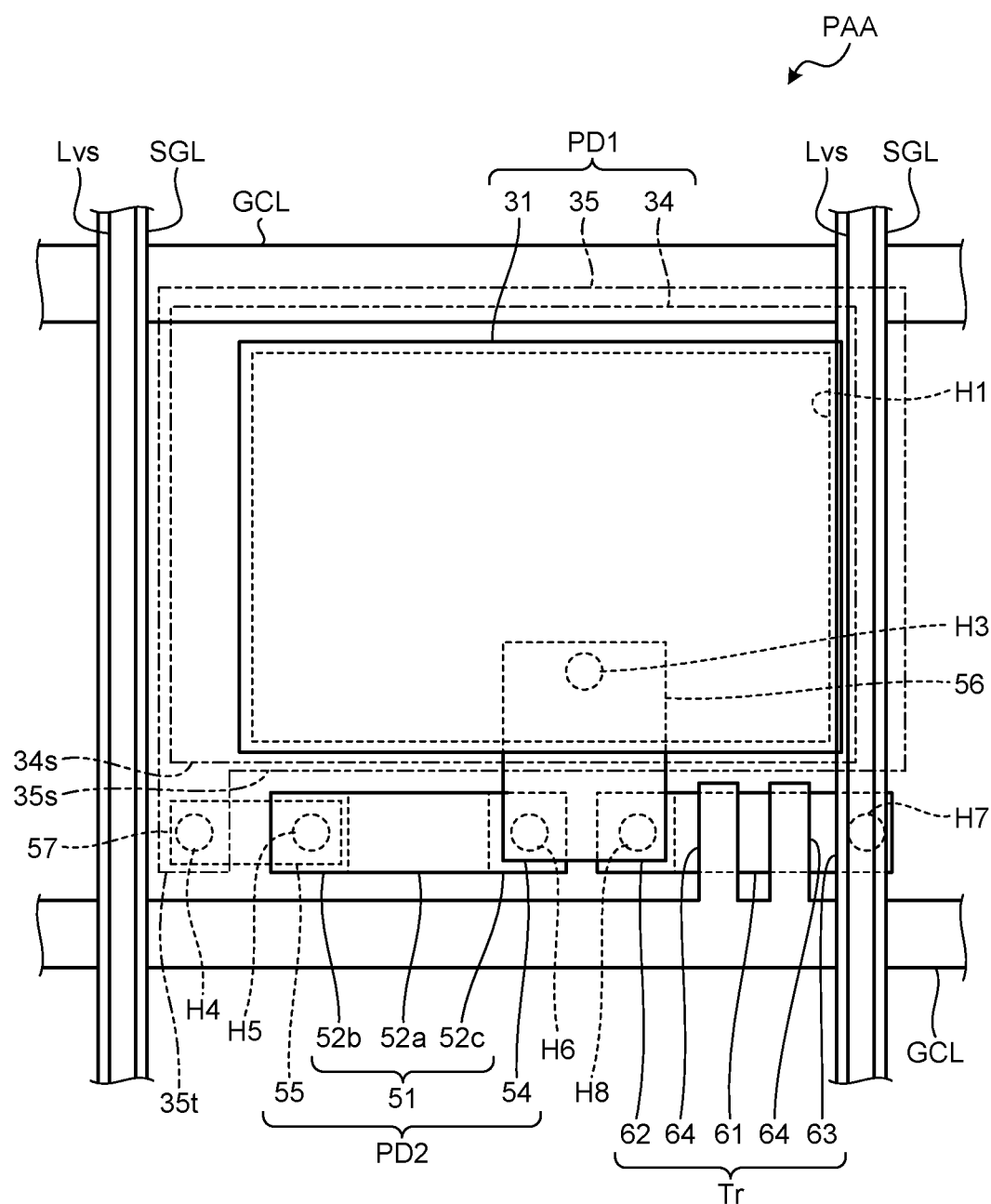
FIG. 17 is a plan view schematically illustrating the partial detection area of the detection device according to a second modification of the third embodiment.

FIG. 17 is a plan view schematically illustrating the partial detection area of the detection device according to a second modification of the third embodiment. As illustrated in FIG. 17, in the second modification, the second photodiode PD2 and the first switching element Tr are provided between the first photodiode PD1 and the gate line GCL that are adjacent in the second direction Dy. More specifically, the second photodiode PD2 and the first switching element Tr are provided between the one side 35s of the anode electrode 35 and the gate line GCL.

The anode electrode 35 has a coupling portion 35t projecting from the one side 35s toward the gate line GCL. The second relay electrode 57 extends along the gate line GCL. One end side of the second relay electrode 57 is coupled to the coupling portion 35t of the anode electrode 35 through the contact hole H4. The other end side (anode electrode 55) of the second relay electrode 57 is coupled to the second semiconductor layer 51 of the second photodiode PD2 through the contact hole H5.

In the second modification, the intensity of the light L2 incident on the second photodiode PD2 is higher than that in the third embodiment, thus increasing the light usage efficiency of the second photodiode PD2.

Fourth Embodiment

Figure 18:
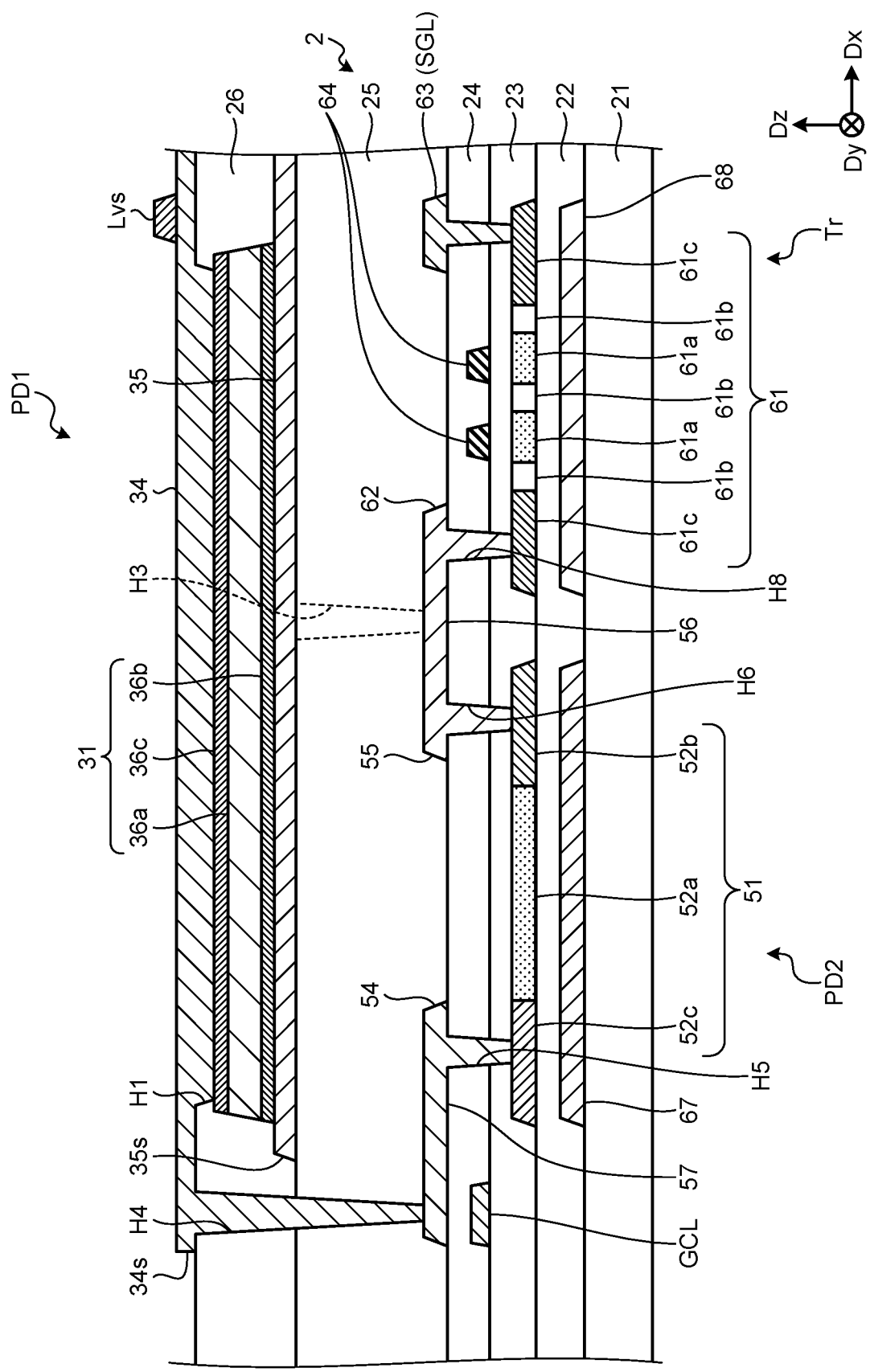
FIG. 18 is a sectional view illustrating a schematic sectional configuration of the detection device according to a fourth embodiment of the present disclosure.

FIG. 18 is a sectional view illustrating a schematic sectional configuration of the detection device according to a fourth embodiment of the present disclosure. The circuit configuration of the fourth embodiment is the same as the circuit configuration illustrated in FIG. 13 for the second embodiment, in which the anode electrode 35 of the first photodiode PD1 and the anode electrode 55 of the second photodiode PD2 are coupled to the first switching element Tr. The cathode electrode 34 of the first photodiode PD1 and the cathode electrode 54 of the second photodiode PD2 are coupled to the reference potential, for example, the ground potential. That is, in the fourth embodiment, the first and the second photodiodes PD1 and PD2 are coupled in parallel to the first switching element Tr in a direction opposite to that in the third embodiment.

As illustrated in FIG. 18, the anode electrode 35, the first semiconductor layer 31, and the cathode electrode 34 are stacked in this order to form the first photodiode PD1 above the second interlayer insulating film 25. The p-type semiconductor layer 36b, the i-type semiconductor layer 36a, and the n-type semiconductor layer 36c are stacked in this order in the third direction Dz to form the first semiconductor layer 31 above the anode electrode 35.

The anode electrode 35 is coupled to the first relay electrode 56 through the contact hole H3. The cathode electrode 34 projects outside the anode electrode 35. An end on the one side 34s of the cathode electrode 34 is provided in a position not overlapping the anode electrode 35, and is coupled to the second relay electrode 57 through the contact hole H4.

In the second semiconductor layer 51 of the second photodiode PD2, the n region 52c, the i region 52a, and the p region 52*b* are arranged in this order in the first direction Dx. A portion of the first relay electrode 56 overlapping the second semiconductor layer 51 serves as the anode electrode 55. A portion of the second relay electrode 57 overlapping the second semiconductor layer 51 serves as the cathode electrode 54.

With the above-described configuration, the cathode electrode 34 of the first photodiode PD1 is coupled to the cathode electrode 54 of the second photodiode PD2. In addition, the anode electrode 35 of the first photodiode PD1 and the anode electrode 55 of the second photodiode PD2 are coupled to the first switching element Tr.

In the present embodiment, the capacitive element Ca stores therein a negative electrical charge during the exposure period Pex. The planar configuration of the fourth embodiment is similar to that of FIG. 15 for the third embodiment, and therefore, is not illustrated. Specifically, the planar configuration of the fourth embodiment is obtained by interchanging the cathode electrode 34 of the first photodiode PD1 with the anode electrode 35, and interchanging the cathode electrode 54 and the n region 52*c* of the second photodiode PD2 with the anode electrode 55 and the p region 52*b*, in FIG. 15. The configuration of the second modification can also be applied to the fourth embodiment.

Fifth Embodiment

Figure 19:
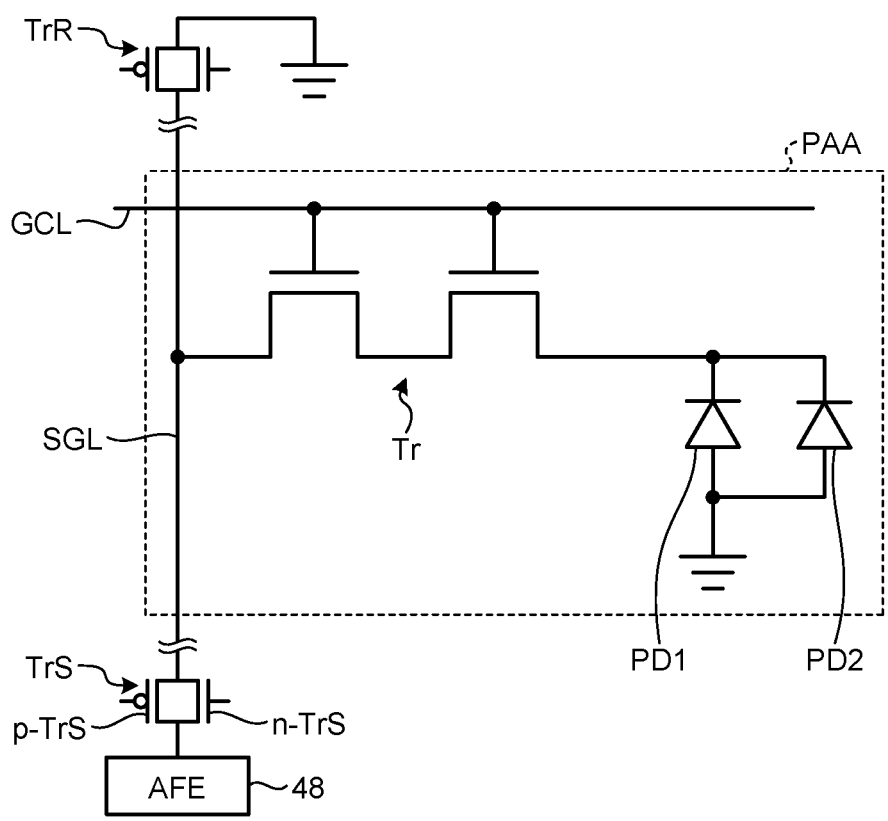
FIG. 19 is a circuit diagram illustrating the partial detection area of the detection device according to a fifth embodiment of the present disclosure.
Figure 20:
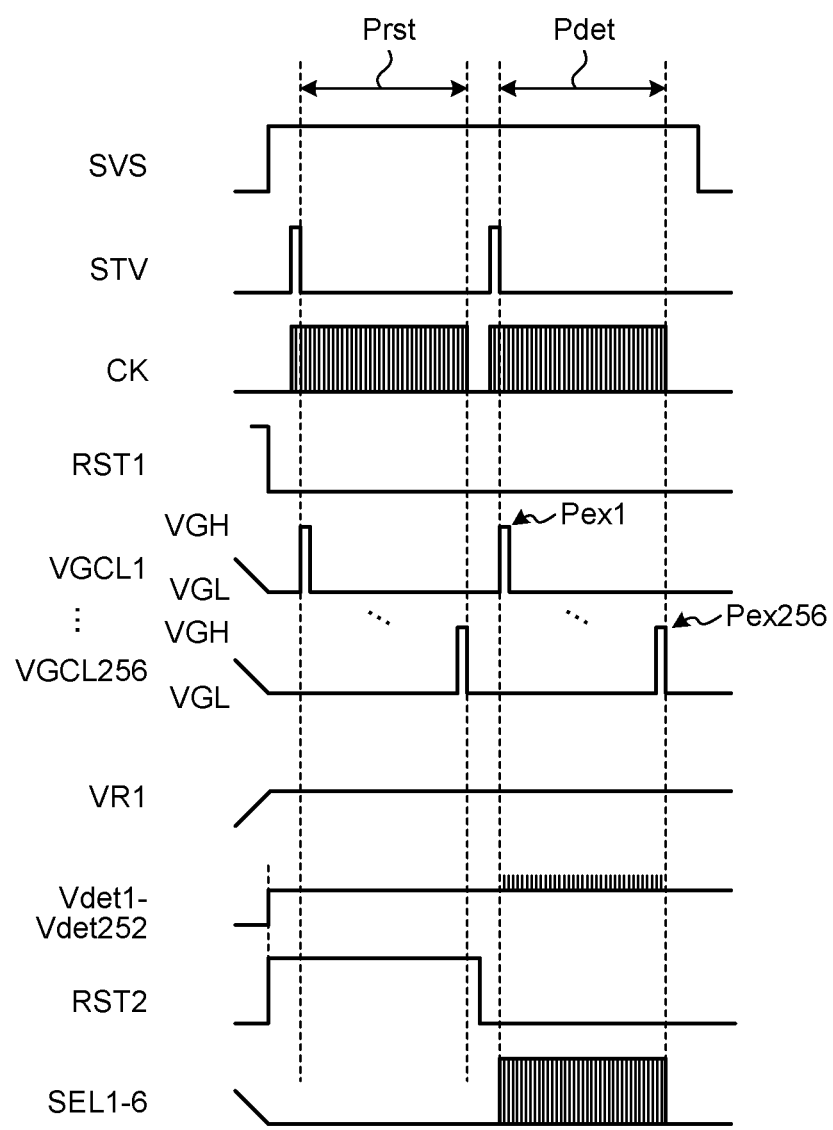
FIG. 20 is a timing waveform diagram illustrating an operation example of the detection device according to the fifth embodiment.

FIG. 19 is a circuit diagram illustrating the partial detection area of the detection device according to a fifth embodiment of the present disclosure. FIG. 20 is a timing waveform diagram illustrating an operation example of the detection device according to the fifth embodiment. As illustrated in FIG. 19, in the fifth embodiment, the partial detection area PAA does not include the capacitive element Ca. That is, the source of the first switching element Tr is coupled to the signal line SGL, and the drain of the first switching element Tr is coupled to the cathode electrode 34 of the first photodiode PD1 and the cathode electrode 54 of the second photodiode PD2. The coupling direction of the first and the second photodiodes PD1 and PD2 may be the same as that in the second embodiment.

When the partial detection area PAA is irradiated with light while the first switching element Tr is on, currents corresponding to an amount of the light flow through the first and the second photodiodes PD1 and PD2. The currents flow from the first and the second photodiodes PD1 and PD2 through the signal line SGL to the AFE 48. That is, in the fifth embodiment, the time to store the electrical charge in the capacitive element Ca can be saved.

As illustrated in FIG. 20, after the gate drive signal VGCL256 is supplied to the gate line GCL256 in the reset period Prst, the exposure period Pex is skipped, and the reading period Pdet starts. During the reading period Pdet, when the gate drive signal VGCL is sequentially supplied to each of the gate lines GCL, the first switching element Tr is turned on to couple the first and the second photodiodes PD1 and PD2 to the signal line SGL. While the first switching element Tr is on, the currents flow from the first and the second photodiodes PD1 and PD2 to the AFE 48. In other words, in the reading period Pdet, a period while the gate drive signal VGCL serving as a high-level voltage signal is supplied serves as the exposure period Pex.

In the fifth embodiment, since the capacitive element Ca is not included, the circuit configuration of the partial detection area PAA can be simplified. In addition, since the detection in the entire area of the detection area AA can be quickly performed, a change in the blood vessel image with time, such as the pulse wave, can be well detected.

While the preferred embodiments of the present disclosure have been described above, the present disclosure is not limited to the embodiments described above. The content disclosed in the embodiments is merely an example, and can be variously modified within the scope not departing from the gist of the present disclosure. Modifications appropriately made within the scope not departing from the gist of the present disclosure naturally belong to the technical scope of the present disclosure.

What is claimed is:

1. A detection device comprising:
   an insulating substrate;
   a plurality of gate lines that are provided on the insulating substrate, and extend in a first direction;
   a plurality of signal lines that are provided on the insulating substrate, and extend in a second direction intersecting the first direction;
   a switching element coupled to each of the gate lines and each of the signal lines;
   a first photoelectric conversion element that comprises a first semiconductor layer containing amorphous silicon, and is coupled to the switching element;
   a second photoelectric conversion element that comprises a second semiconductor layer containing polysilicon, and is coupled to the switching element;
   a first interlayer insulating film provided above the second semiconductor layers of a plurality of the second photoelectric conversion elements; and
   a second interlayer insulating film provided above the first interlayer insulating film, wherein
   an anode electrode of the first photoelectric conversion element is provided above the second interlayer insulating film,
   a relay electrode provided above the first interlayer insulating film,
   the second semiconductor layer is coupled to the relay electrode through a contact hole provided in the first interlayer insulating film,
   a cathode electrode of the first photoelectric conversion element is provided above the first semiconductor layer, and is coupled to the relay electrode through a contact hole provided in the second interlayer insulating film, and
   the first photoelectric conversion element is provided so as to overlap the second photoelectric conversion element in plan view.

2. The detection device according to claim 1, wherein the first photoelectric conversion element and the second photoelectric conversion element are provided in an area surrounded by the gate lines and the signal lines.

3. The detection device according to claim 1, wherein a cathode electrode of the first photoelectric conversion element and a cathode electrode of the second photoelectric conversion element are coupled to the switching element.

4. The detection device according to claim 1, wherein an anode electrode of the first photoelectric conversion element and an anode electrode of the second photoelectric conversion element are coupled to the switching element.

5. The detection device according to claim 1, wherein
   the first semiconductor layer comprises a p-type semiconductor layer, an i-type semiconductor layer, and an n-type semiconductor layer, and the i-type semiconductor layer is provided between the p-type semiconductor layer and the n-type semiconductor layer in a direction orthogonal to the insulating substrate.

6. The detection device according to claim 1, wherein
the second semiconductor layer comprises a p region, an i region, and an n region, and
the i region is provided between the p region and the n region in plan view.

7. The detection device according to claim 1, wherein
a cathode electrode of the first photoelectric conversion element is provided above the second interlayer insulating film.

8. The detection device according to claim 7, wherein
the anode electrode of the first photoelectric conversion element is provided above the first semiconductor layer, and is coupled to the relay electrode through a contact hole provided in the second interlayer insulating film.

9. The detection device according to claim 1, wherein the switching element comprises a third semiconductor layer containing polysilicon.

10. The detection device according to claim 1, wherein the first photoelectric conversion element is provided adjacent to the second photoelectric conversion element in plan view.

11. The detection device according to claim 1, wherein
the insulating substrate comprises a detection area provided with a plurality of the first photoelectric conversion elements and a plurality of the second photoelectric conversion elements, and comprises a peripheral area between the detection area and ends of the insulating substrate,
the peripheral area is provided with a drive circuit configured to drive a plurality of the switching elements, and
the drive circuit comprises a drive circuit switching element comprising a fourth semiconductor layer containing polysilicon.

12. The detection device according to claim 11, wherein the drive circuit comprises at least one of a gate line drive circuit configured to drive the gate lines and a signal line selection circuit configured to couple the signal lines to a detection circuit.

* * * * *